United States Patent
Yang et al.

(10) Patent No.: US 9,920,167 B2
(45) Date of Patent: Mar. 20, 2018

(54) POLYMER AND ORGANIC LIGHT-EMITTING DIODE INCLUDING THE SAME

(71) Applicant: SAMSUNG ELECTRONICS CO., LTD., Suwon-si, Gyeonggi-do (KR)

(72) Inventors: Hye-yeon Yang, Yongin-si (KR); Ho-suk Kang, Yongin-si (KR); Jhun-mo Son, Yongin-si (KR); Yong-sik Jung, Yongin-si (KR); Mi-jeong Kim, Yongin-si (KR); Tae-gon Kim, Yongin-si (KR); Won-jae Joo, Yongin-si (KR); Hyeon-ho Choi, Yongin-si (KR); Seok-hwan Hong, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 736 days.

(21) Appl. No.: 13/671,257

(22) Filed: Nov. 7, 2012

(65) Prior Publication Data

US 2013/0146849 A1 Jun. 13, 2013

(30) Foreign Application Priority Data

Dec. 9, 2011 (KR) .......................... 10-2011-0132128

(51) Int. Cl.
*H01L 51/54* (2006.01)
*C08G 73/06* (2006.01)
*H01L 51/00* (2006.01)
*H01L 51/50* (2006.01)

(52) U.S. Cl.
CPC ......... *C08G 73/06* (2013.01); *C08G 73/0672* (2013.01); *H01L 51/0034* (2013.01); *H01L 51/0035* (2013.01); *H01L 51/0043* (2013.01); *H01L 51/0039* (2013.01); *H01L 51/0085* (2013.01); *H01L 51/5016* (2013.01)

(58) Field of Classification Search
CPC ............... C08G 73/06; C08G 73/0666; C08G 73/0672; H01L 51/0032; H01L 51/0034; H01L 51/0035; H01L 51/0043; H01L 51/0039; H01L 51/0038; H01L 51/0084; H01L 51/0085; H01L 51/50; H01L 51/5012; H01L 51/5016; C09K 11/06; C09K 2211/00; C09K 2211/18; C09K 2211/185; C09K 2211/14; C09K 2211/1408; C09K 2211/1416; C09K 2211/1425; C09K 2211/1441; C09K 2211/1466
USPC ...... 428/690, 691, 917, 411, 4, 336; 427/58, 427/66; 524/610; 257/40, 88–104, 257/E51.001–E51.052; 252/301.16–301.35; 313/500–512
See application file for complete search history.

(56) References Cited

U.S. PATENT DOCUMENTS

| | | | | |
|---|---|---|---|---|
| 8,558,007 | B2 * | 10/2013 | Yang et al. | 548/440 |
| 2003/0094595 | A1 * | 5/2003 | Son | C08G 61/02 252/301.16 |
| 2004/0077824 | A1 * | 4/2004 | O'Dell et al. | 528/394 |
| 2006/0166037 | A1 * | 7/2006 | Son | C07D 265/38 428/690 |
| 2009/0066224 | A1 * | 3/2009 | Yu et al. | 313/504 |
| 2009/0206731 | A1 * | 8/2009 | Leadbeater | C07D 209/88 313/504 |
| 2010/0108989 | A1 * | 5/2010 | Busing | C07C 15/24 257/40 |

(Continued)

FOREIGN PATENT DOCUMENTS

| | | |
|---|---|---|
| JP | 2005-243394 A | 6/2005 |
| JP | 2006-077106 A | 3/2006 |
| JP | 2006-128636 A | 5/2006 |

(Continued)

OTHER PUBLICATIONS

Koene et al. Chem. Mater. 1998, 10, 2235-2250. Date of publication: Jul. 21, 1998.*

(Continued)

*Primary Examiner* — Andrew K Bohaty
(74) *Attorney, Agent, or Firm* — Cantor Colburn LLP

(57) ABSTRACT

A polymer having a repeating unit represented by Formula 1, wherein $R_1$ through $R_{14}$, $X_1$, and $Ar_1$ are the same as defined in the detailed description, and an organic light-emitting diode including the polymer are described.

14 Claims, 4 Drawing Sheets

Formula 1

(56) References Cited

U.S. PATENT DOCUMENTS

2010/0276674 A1* 11/2010 Conway .............. H01L 51/0039
                                                            257/40
2011/0175068 A1* 7/2011 Yang et al. ..................... 257/40

FOREIGN PATENT DOCUMENTS

| JP | 2008-231135 A | 10/2008 |
| KR | 10-2003-0027381 A | 4/2003 |
| KR | 10-2006-0085298 A | 7/2006 |
| KR | 10-2007-0108392 A | 11/2007 |
| WO | 9920081 A2 | 4/1999 |
| WO | 2010065700 A2 | 6/2010 |
| WO | 2010075421 A2 | 7/2010 |

OTHER PUBLICATIONS

Jian He et al. "Nonconjugated Carbazoles: A Series of Novel Host Materials for Highly Efficient Blue Electrophosphorescent OLEDs", J. Phys. Chem. C 2009, 113, 6761-6767.

Pamela Schrögel et al. "A Series of CBP-derivatives as host materials for blue phosphorescent organic light-emitting diodes", J. Mater. Chem., 2011, 21, 2266-2273.

Shizuo Tokito et al. "Confinement of triplet energy on phosphorescent molecules for highly-efficient organic blue-light emitting devices", Applied Physics Letters 83, 569-571 (2003).

Korean Office Action dated Aug. 11, 2017, issued for the Korean Patent Application No. 10-2011-0132128, with English Translation.

\* cited by examiner

POLYMER AND ORGANIC LIGHT-EMITTING DIODE INCLUDING THE SAME

CROSS-REFERENCE TO RELATED APPLICATIONS

This application claims priority to Korean Patent Application No. 10-2011-0132128, filed on Dec. 9, 2011, and all the benefits accruing therefrom under 35 U.S.C. § 119, the contents of which in their entirety are herein incorporated by reference.

BACKGROUND

1. Field

The present disclosure relates to polymers and organic light-emitting diodes including the polymers.

2. Description of the Related Art

Organic light-emitting devices are lightweight self-emissive devices, which are manufactured using a relatively small number of components by simplified manufacturing processes. Organic light-emitting devices provide high-quality images and have wide viewing angles. Furthermore, organic light-emitting devices provide high color purity, realize full moving images, have low power consumption and operate at low voltage. Because of these characteristics, organic light-emitting devices are suitable for use in any kinds of electronic devices.

Typically, an organic light-emitting device has a structure including a substrate, an anode, organic layers, and a cathode, which are sequentially stacked on the substrate. The organic layers include a hole transport layer (HTL), an emission layer (EML), and an electron transport layer (ETL).

When a voltage is applied to the anode and the cathode, holes injected from the anode move to the EML via the HTL, and electrons injected from the cathode move to the EML via the ETL. The holes and electrons recombine in the EML to generate excitons. The excitons radiatively decay to emit light having a wavelength corresponding to the band gap of a material.

Materials used to form organic layers may be classified as either vacuum-depositable materials or solution-coatable materials according to the method used to form the organic layer. Solution-coatable materials should be miscible with a solvent to form a composition that may be coated on a substrate by a known solution coating method, such as inkjet printing, screen printing, or spin coating.

SUMMARY

An exemplary embodiment provides polymers having a novel structure.

Another exemplary embodiment provides organic light-emitting diodes including the polymers.

Additional aspects will be set forth in part in the description which follows and, in part, will be apparent from the description, or may be learned by practice of the presented embodiments.

Another exemplary embodiment provides a polymer which includes a repeating unit represented by Formula 1 below:

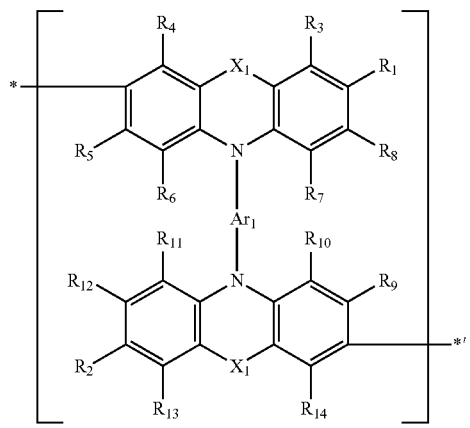

Formula 1 wherein $X_1$ is a single bond, $-[C(R_{20})(R_{21})]_a-$, $-Si(R_{22})(R_{23})-$, $-S-$, or $-O-$, and a is an integer of 1 to 5;

$R_1$ through $R_{14}$ and $R_{20}$ through $R_{23}$ are each independently hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, a substituted or unsubstituted $C_2$-$C_{60}$ heteroaryl group, $-N(Q_1)(Q_2)$, or $-Si(Q_3)(Q_4)(Q_5)$;

$Q_1$ through $Q_5$ are each independently hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_3$-$C_{60}$ cycloalkyl group, a $C_5$-$C_{60}$ aryl group, or a $C_2$-$C_{60}$ heteroaryl group; and $Ar_1$ is a divalent group having two substituted or unsubstituted benzene rings that are linked to each other by a single bond or are fused with each other via a 5-membered ring.

The polymer may further include an additional repeating unit represented by Formula 2 below:

$$*-[-Ar_2-]-*'$$ Formula 2 wherein $Ar_2$ is a divalent group having two substituted or unsubstituted benzene rings that are linked to each other by a single bond, a divalent group having two substituted or unsubstituted naphthalene groups that are linked to each other by a single bond, and a fluorenylene group.

According to another exemplary embodiment, an organic light-emitting diode includes a substrate; a first electrode; a second electrode; and an organic layer interposed between the first electrode and the second electrode and including the polymer described above.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
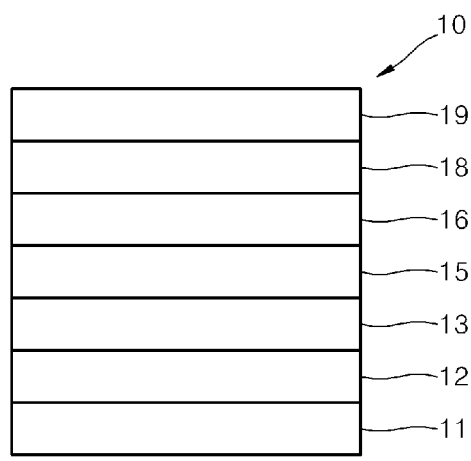
FIG. 1 is a schematic cross-sectional view of an exemplary embodiment of an organic light-emitting diode (OLED)

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"Aryloxy" as used herein means an aryl moiety that is linked via an oxygen (i.e., —O-aryl).

"Arylthio" as used herein means an aryl moiety that is linked via a sulfur (i.e., —S-aryl).

"Salts" as used herein includes derivatives of the disclosed compounds in which the parent compound is modified by making inorganic and organic, base addition salts thereof, for example a Na, Ca, Mg, K, hydroxide, carbonate, bicarbonate, or the like salt.

"In a range" as used herein includes the endpoints of the recited range.

According to an embodiment, a polymer includes a repeating unit represented by Formula 1 below:

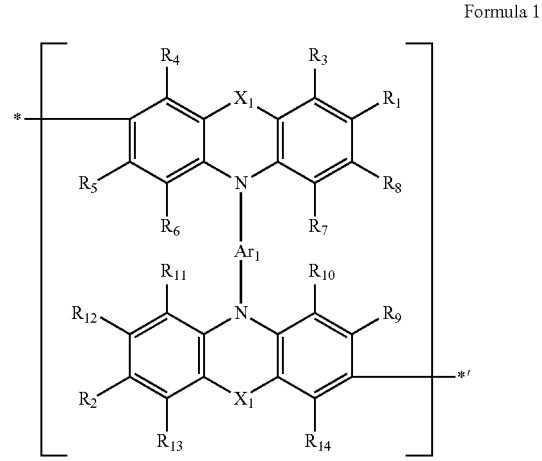

Formula 1

In Formula 1, $X_1$ may be a linking group that allows the two carbazole-based condensed ring systems in Formula 1 to maintain a high triplet potential. For example, $X_1$ may be a single bond, —[C($R_{20}$)($R_{21}$)]$_a$—, —Si($R_{22}$)($R_{23}$)—, —S—, or —O—. In this regard, a may be an integer of 1 to 5.

$R_1$ through $R_{14}$ and $R_{20}$ through $R_{23}$ may each independently be hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, a substituted or unsubstituted $C_2$-$C_{60}$ heteroaryl group, —N($Q_1$)($Q_2$), or —Si($Q_3$)($Q_4$)($Q_5$). In this regard, $Q_1$ through $Q_5$ may each independently hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_3$-$C_{60}$ cycloalkyl group, a $C_5$-$C_{60}$ aryl group, or a $C_2$-$C_{60}$ heteroaryl group.

For example, $X_1$ may be —[C($R_{20}$)($R_{21}$)]$_a$—. In this regard, $R_{20}$ and $R_{21}$ may each independently be hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a $C_1$-$C_{10}$ alkyl group, or a $C_1$-$C_{10}$ alkoxy group. In one embodiment, $R_{20}$ and $R_{21}$ may each independently be hydrogen. In this formula of $X_1$, a may be 1, 2, or 3. For example, a may be 2.

In Formula 1, $R_1$ and $R_2$ may each independently be hydrogen; deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof; a phenyl group; a naphthyl group; an anthryl group; a phenanthrenyl group; a pyrenyl group; a chrysenyl group; a pyridinyl group; a pyrimidinyl group; a pyrazinyl group; an imidazolyl group; an indolyl group; or a phenyl group, a naphthyl group, an anthryl group, a phenanthrenyl group, a pyrenyl group, a chrysenyl group, a pyridinyl group, a pyrimidinyl group, a pyrazinyl group, an imidazolyl group, and an indolyl group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a $C_1$-$C_{20}$ alkyl group, and a $C_1$-$C_{20}$ alkoxy group.

For example, $R_1$ and $R_2$ may each independently be hydrogen; a $C_1$-$C_{10}$ alkyl group; a $C_1$-$C_{10}$ alkyl group that is substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof; or Formulae 3A through 3I, but are not limited thereto:

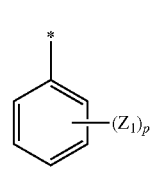

Formula 3A

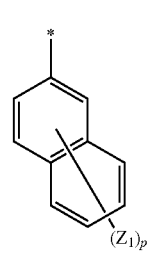

Formula 3B

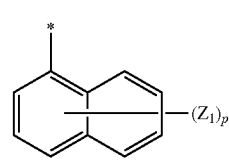

Formula 3C

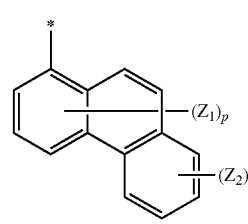

Formula 3D

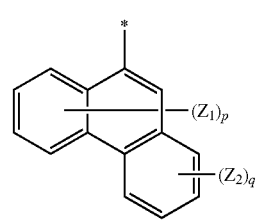

Formula 3E

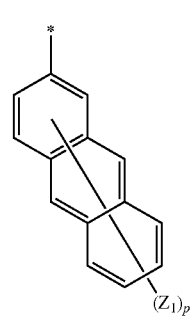

Formula 3F

-continued

Formula 3G

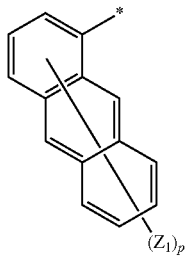

Formula 3H

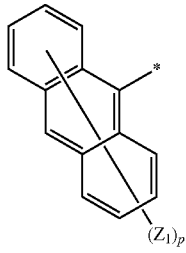

Formula 3I

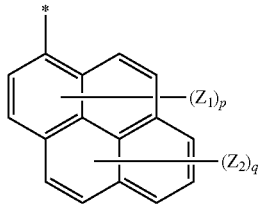

In Formulae 3A through 3I, $Z_1$ and $Z_2$ may each independently be hydrogen; deuterium; a halogen atom; a hydroxyl group; a cyano group; a nitro group; an amino group; an amidino group; a hydrazine group; a hydrazone group; a carboxyl group or a salt thereof; an ester group, a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof.

For example, $Z_1$ and $Z_2$ may each independently be a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, a 3,7-dimethyloctyl group, a methoxy group, an ethoxy group, a propyloxy group, an i-propyloxy group, a butoxy group, an i-butoxy group, a t-butoxy group, a pentyloxy group, a hexyloxy group, a heptyloxy group, an octyloxy group, a 2-ethylhexyloxy group, a nonyloxy group, a decyloxy group, or a 3,7-dimethyloxy group, but are not limited thereto.

In Formulae 3A through 3I, p may be an integer of 1 to 9, and q may be an integer of 1 to 4. If p is 2 or more, at least two $Z_1$ groups may be identical to or different from each other. If q is 2 or more, at least two $Z_2$ groups may be identical to or different from each other.

In Formula 1, $R_1$ and $R_2$ may be a protecting group for the carbazole-based condensed rings to which $R_1$ and $R_2$ are linked. Thus, $R_1$ and $R_2$ may be Formulae 3A through 3I, but are not limited thereto.

In Formula 1, $R_3$ through $R_{14}$ may each independently be hydrogen; deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof. For example, $R_3$ through $R_{14}$ may each independently be hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, or a phosphoric acid or a salt thereof. For example, $R_3$ through $R_{14}$ may each independently be hydrogen, but are not limited thereto.

In Formula 1, the nitrogen atoms of the two carbazole-based condensed ring systems are linked to each other via $Ar_1$. In addition, as shown by Formula 1' below, the main backbone of the repeating unit of Formula 1 can be traced from the $3^{rd}$ carbon atom of a first (the top) carbazole-based condensed ring system to the nitrogen atom of the first carbazole-based condensed ring system, to the $Ar_1$ group, to the nitrogen atom of a second (the bottom) carbazole-based condensed ring system, and to the $6^{th}$ carbon atom of the second carbazole-based condensed ring system.

Accordingly, it is possible to prepare a polymer in which energy properties (e.g., high triplet potential, high HOMO energy level, excellent charge balancing properties) and charge conduction properties of the two carbazole-based condensed ring systems included in the main backbone of the repeating unit of Formula 1 are maintained at the maximum level. In particular, in the polymer including the repeating unit of Formula 1, conjugation lengths may be maintained short and thus the polymer may have a high triplet state energy level. In addition, the repeating unit of Formula 1 may increase a morphological stability of a film comprising the polymer, and thus the characteristics of a device including the polymer comprising the repeating unit of Formula 1 may not deteriorate during the operation and/or storage of the device. For example, deterioration of device characteristics that is caused by defects due to aggregation of the polymer when a device including the polymer operates may be substantially prevented.

Formula 1'

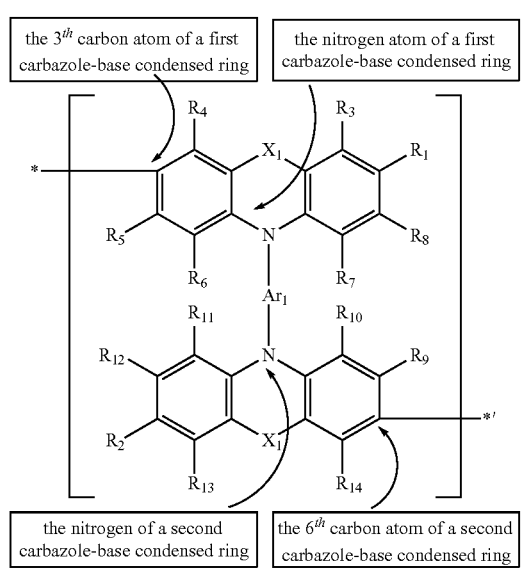

The Ar$_1$ group may be a divalent group including two substituted or unsubstituted benzene rings. In this regard, the two substituted or unsubstituted benzene rings included in the Ar$_1$ group may be linked to each other by a single bond or may be fused with each other via a 5-membered ring. The backbone of the 5-membered ring may consist of only carbon atoms or may include hetero atoms such as O or S in addition to carbon atoms.

For example, Ar$_1$ may be represented by one of Formulae 4A through 4O below:

Formula 4A

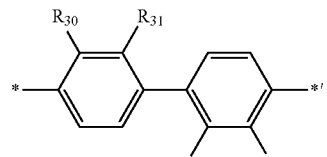

Formula 4B

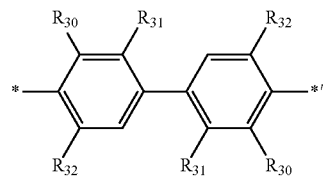

Formula 4C

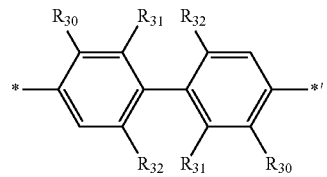

Formula 4D

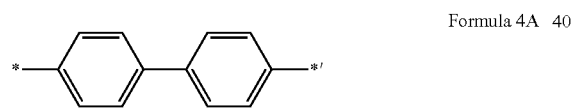

Formula 4E

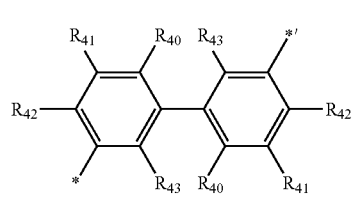

Formula 4F

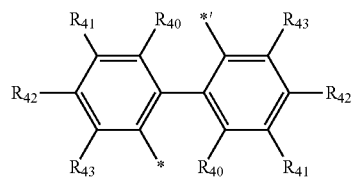

Formula 4G

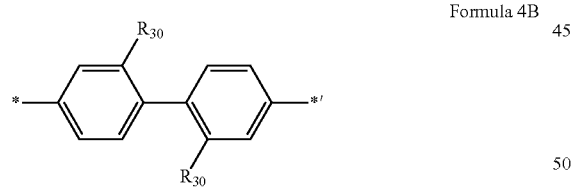

Formula 4H

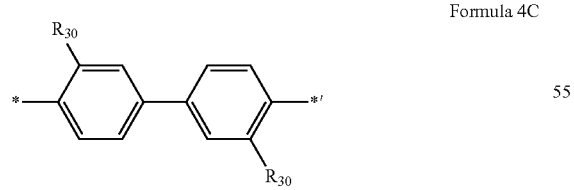

Formula 4I

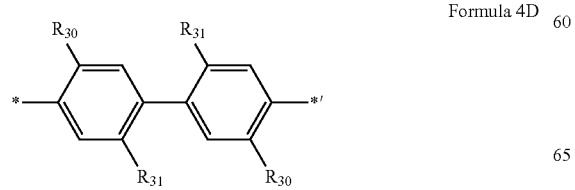

Formula 4J

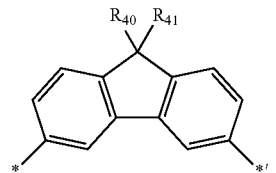

Formula 4K

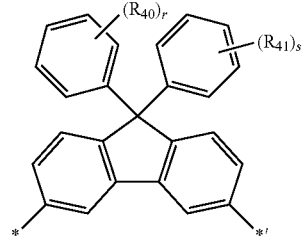

Formula 4L

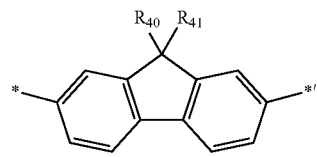

-continued

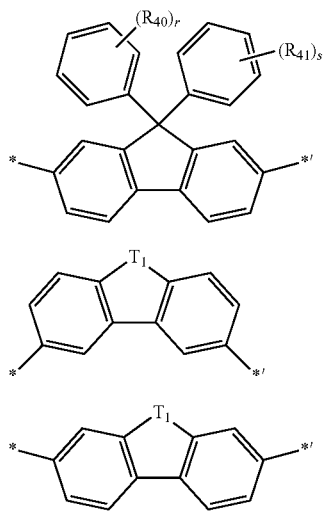

Formula 4M

Formula 4N

Formula 4O

In Formulae 4A through 4O, $R_{30}$ through $R_{32}$ may each independently be a deuterium atom; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof.

In Formulae 4A through 4O, $R_{40}$ through $R_{43}$ may each independently be hydrogen; deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof.

In Formulae 4A through 4O, r and s may each independently be an integer of 1 to 5. For example, r and s may each independently be 1 or 2.

$T_1$ in Formulae 4N through 4O may be —O—, —S—, or —$SO_2$—.

In Formula 1, $Ar_1$ may be a divalent group including two substituted benzene rings. For example, $Ar_1$ may be represented by Formula 100 below (wherein, a detailed description of $Q_{100}$ is already provided in the description of $R_{30}$ above, t is an integer of 1 to 4), or Formula 4J or 4K above. In this regard, a dihedral angle between the two substituted benzene rings, i.e., α of each of Formulae 100', 4J' and 4K' may be about 33° to about 82°:

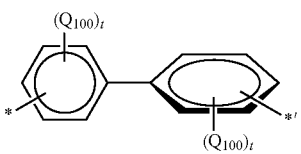

Formula 100

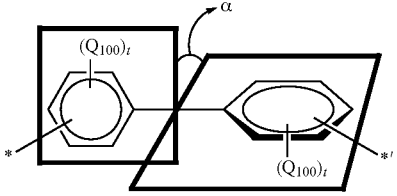

Formula 100'

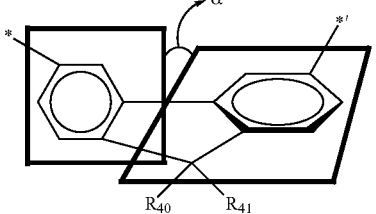

Formula 4J'

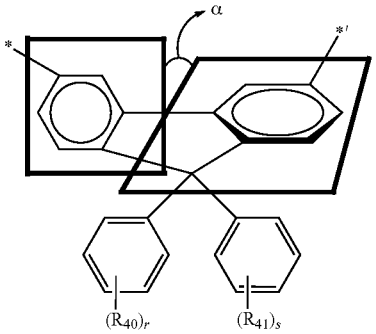

Formula 4K'

In an exemplary embodiment, a polymer including the repeating unit of Formula 1 wherein the dihedral angle α of $Ar_1$ is within the range described above may have a high triplet state energy level. The α value may be adjusted by varying the type and/or number of $Q_{100}$, $R_{40}$ and $R_{41}$ groups in Formulae 100, 4J, and 4K.

In another exemplary embodiment, $Ar_1$ that satisfies the condition where the dihedral angle α is within the range described above may be represented by one of Formulae 4B through 4K, but is not limited thereto.

In yet another exemplary embodiment, the polymer may be a homopolymer consisting essentially of the repeating unit of Formula 1 above. Alternatively, the polymer may be a homopolymer consisting of the repeating unit of Formula 1 above and terminal units derived from Formula 1 above.

In still another exemplary embodiment, the polymer may be a copolymer further including an additional repeating unit represented by Formula 2 below:

*—[—$Ar_2$—]—*'      Formula 2

In Formula 2, $Ar_2$ is a divalent group including two substituted or unsubstituted benzene rings that are linked to each other by a single bond, a divalent group including two substituted or unsubstituted naphthalene groups that are linked to each other by a single bond, and fluorenylene. If $Ar_2$ is at least two different divalent groups, the $Ar_2$ groups may be linked to each other by a single bond or via the repeating unit of Formula 1. Ar$_2$ may be a divalent group having a symmetrical structure.

For example, Ar$_2$ may be Formulae 5A through 5I, but is not limited thereto:

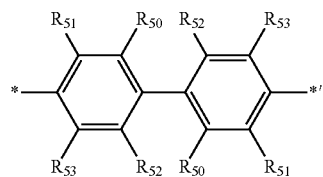

Formula 5A

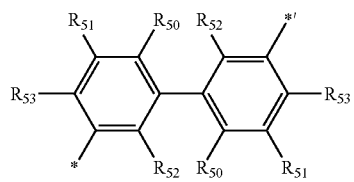

Formula 5B

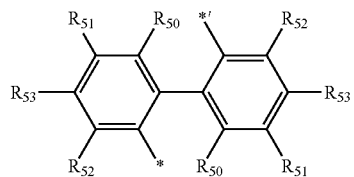

Formula 5C

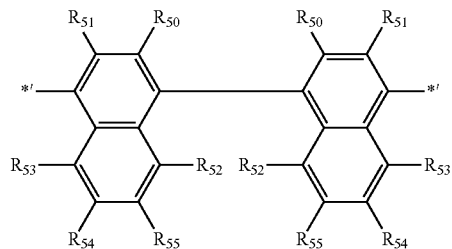

Formula 5D

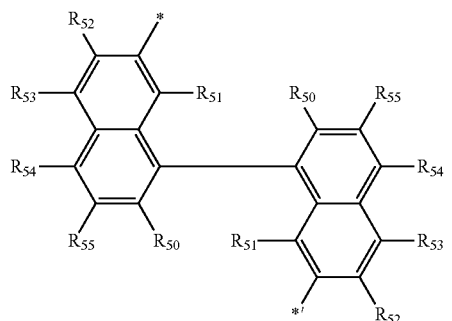

Formula 5E

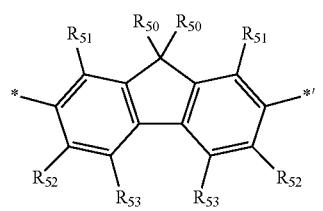

Formula 5F

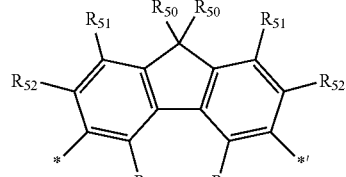

Formula 5G

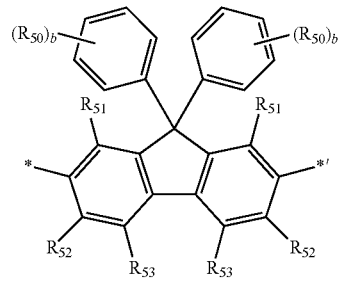

Formula 5H

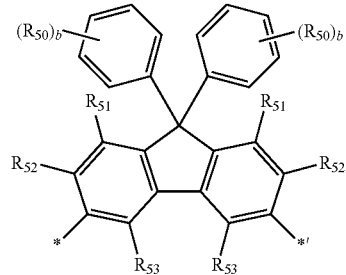

Formula 5I

In Formulae 5A through 5I, R$_{50}$ through R$_{55}$ may each independently be hydrogen; deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a C$_1$-C$_{20}$ alkyl group; a C$_1$-C$_{20}$ alkoxy group; or a C$_1$-C$_{20}$ alkyl group and a C$_1$-C$_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof, and b may be an integer of 0 to 5 (e.g., an integer of 1 to 3).

Ar$_2$ may be represented by Formulae 5A-1 through 5A-4, 5B-1, 5B-2, 5C-1, 5D-1, 5E-1, 5F-1, 5G-1, 5H-1, and 5I-1 below:

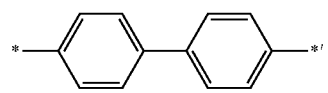

Formula 5A-1

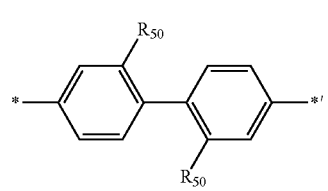

Formula 5A-2

-continued

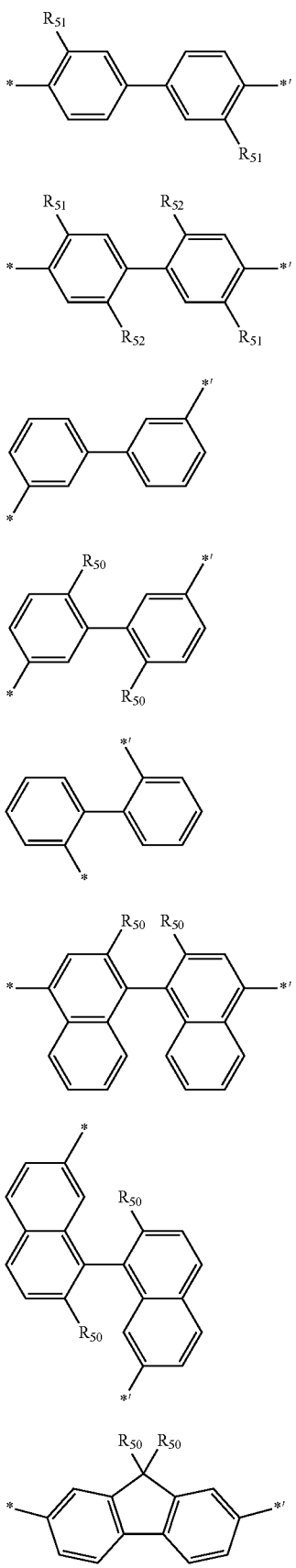

Formula 5A-3

Formula 5A-4

Formula 5B-1

Formula 5B-2

Formula 5C-1

Formula 5D-1

Formula 5E-1

Formula 5F-1

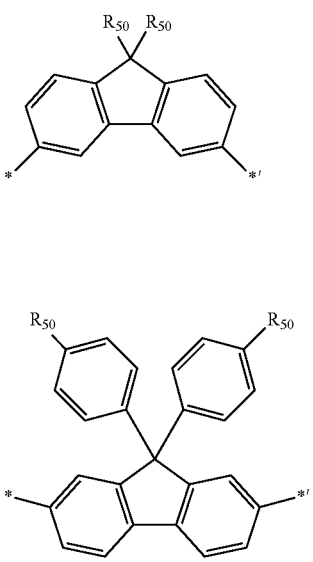

Formula 5G-1

Formula 5H-1

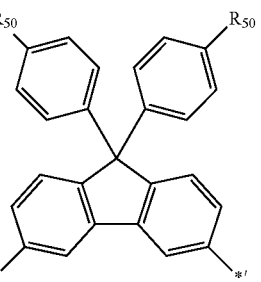

Formula 5I-1

In Formulae 5A-1 through 5A-4, 5B-1, 5B-2, 5C-1, 5D-1, 5E-1, 5F-1, 5G-1, 5H-1, and 5I-1, a detailed description of $R_{50}$ through $R_{52}$ is already provided above.

For example, in Formulae 5A-1 through 5A-4, 5B-1, 5B-2, 5C-1, 5D-1, 5E-1, 5F-1, 5G-1, 5H-1, and 5I-1, $R_{50}$ through $R_{52}$ may each independently be a $C_1$-$C_{20}$ alkyl group (e.g., a $C_1$-$C_{10}$ alkyl group); a $C_1$-$C_{20}$ alkoxy group (e.g, a $C_1$-$C_{10}$ alkoxy group); or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof.

In yet another exemplary embodiment, the polymer may be a copolymer consisting essentially of the repeating units of Formula 1 and Formula 2 above. Alternatively, the polymer may be a copolymer consisting of the repeating units of Formula 1 and Formula 2 above and terminal units derived from Formula 1 and Formula 2 above. The copolymer may be random, block, or alternating as further described below.

The repeating unit of the polymer may be represented by Formula 1A below:

Formula 1A

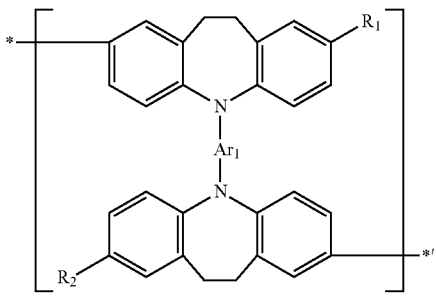

wherein a detailed description of $R_1$, $R_2$, and $Ar_1$ is already provided above.

For example, in Formula 1A, $R_1$ and $R_2$ may each independently be hydrogen; deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof; a phenyl group; a naphthyl group; an anthryl group; a phenanthrenyl group; a pyrenyl group; a chrysenyl group; a pyridinyl group; a pyrimidinyl group; a pyrazinyl group; an imidazolyl group; an indolyl group; or a phenyl group, a naphthyl group, an anthryl group, a phenanthrenyl group, a pyrenyl group, a chrysenyl group, a pyridinyl group, a pyrimidinyl group, a pyrazinyl group, an imidazolyl group, and an indolyl group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a $C_1$-$C_{20}$ alkyl group, and a $C_1$-$C_{20}$ alkoxy group (e.g., $R_1$ and $R_2$ may each independently be represented by one of hydrogen; a $C_1$-$C_{10}$ alkyl group; a $C_1$-$C_{10}$ alkyl group that is substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof; and Formulae 3A through 3I above), and $Ar_1$ may be represented by one of Formulae 4A through 4O (e.g., one of Formulae 4B through 4K above).

In addition, in Formula 1A, $R_1$ and $R_2$ may each independently be represented by Formula 3A-1:

Formula 3A-1

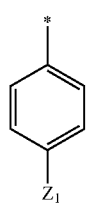

In Formula 3A-1, $Z_1$ may be a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof.

The polymer may include the repeating unit of Formula 1A described above and the additional repeating unit of Formula 2 wherein $Ar_2$ is represented by Formulae 5A through 5I (e.g., Formulae 5A-1 through 5A-4, 5B-1, 5B-2, 5C-1, 5D-1, 5E-1, 5F-1, 5G-1, 5H-1, and 5I-1), but is not limited thereto.

If the polymer further includes the additional repeating unit of Formula 2, the polymer may be an alternating copolymer including of the repeating unit of Formula 1 and the additional repeating unit of Formula 2, a block copolymer including blocks of the repeating unit of Formula 1 and the additional repeating unit of Formula 2, or a random copolymer including the repeating unit of Formula 1 and the additional repeating unit of Formula 2. If the polymer is a random copolymer including the repeating unit of Formula 1 and the additional repeating unit of Formula 2, a molar ratio of the repeating unit of Formula 1 to the additional repeating unit of Formula 2 may be in the range of about 1:99 to about 99:1, for example, in the range of about 3:7 to about 7:3. Even more specifically, the molar ratio of the repeating unit of Formula 1 to the additional repeating unit of Formula 2 may be about 5:5, but is not limited thereto.

Examples of the $C_1$-$C_{20}$ alkyl group include, but are not limited to, a methyl group, an ethyl group, a propyl group, an i-propyl group, a butyl group, an i-butyl group, a t-butyl group, a pentyl group, a hexyl group, a heptyl group, an octyl group, a 2-ethylhexyl group, a nonyl group, a decyl group, and a 3,7-dimethyloctyl group.

Examples of the $C_1$-$C_{20}$ alkoxy group include, but are not limited to, a methoxy group, an ethoxy group, a propyloxy group, an i-propyloxy group, a butoxy group, an i-butoxy group, a t-butoxy group, a pentyloxy group, a hexyloxy group, a heptyloxy group, an octyloxy group, a 2-ethylhexyloxy group, a nonyloxy group, a decyloxy group, and a 3,7-dimethyloctyloxy group.

The substituent of the "substituted benzene" group and the "substituted naphthalene" group is already described above in the description of $R_{30}$.

A weight average molecular weight ("Mw") of the polymer including the repeating unit of Formula 1 may be in the range of about 1,000 Daltons ("Da") to about 1,000,000 Da based on polystyrene, and a polymer dispersity index ("PDI") thereof may be in the range of about 1.5 to about 5; however, the weight average molecular weight and PDI of the polymer are not limited thereto. For example, the polymer including the repeating unit of Formula 1 may be in the range of about 2,000 Daltons ("Da") to about 500,000 Da based on polystyrene, and a polymer dispersity index ("PDI") thereof may be in the range of about 1.5 to about 3; or the polymer including the repeating unit of Formula 1 may be in the range of about 2,000 Daltons ("Da") to about 10,000 Da based on polystyrene, and a polymer dispersity index ("PDI") thereof may be in the range of about 1.5 to about 2. The weight average molecular weight and PDI (e.g. measured by gel permeation chromatography ("GPC"), calculated using polystyrene) may be adjusted by considering a structure and desired characteristics of an organic light-emitting diode including the polymer).

The term "substituted X" in "substituted or unsubstituted X (X is a certain substituent)" used herein refers to X in which at least one hydrogen atom of X is substituted with a deuterium atom; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{60}$ alkyl group; a $C_2$-$C_{60}$ alkenyl group; a $C_2$-$C_{60}$ alkynyl group; a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof; a $C_3$-$C_{60}$ cycloalkyl group; a $C_3$-$C_{60}$ cycloalkenyl group; a $C_5$-$C_{60}$ aryl group; a $C_5$-$C_{60}$ aryloxy group; a $C_2$-$C_{60}$ heteroaryl group; a $C_3$-$C_{60}$ cycloalkyl group, a $C_3$-$C_{60}$ cycloalkenyl group, a $C_5$-$C_{60}$ aryl group, a $C_5$-$C_{60}$ aryloxy group, and a $C_2$-$C_{60}$ heteroaryl group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a $C_1$-$C_{60}$ alkyl group, and a $C_1$-$C_{60}$ alkoxy group; —N($Q_{101}$)($Q_{102}$); or —Si($Q_{103}$)($Q_{104}$)($Q_{105}$). In this regard, $Q_{101}$ through $Q_{105}$ may each independently be hydrogen, a halogen atom, a hydroxyl group, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, or a substituted or unsubstituted $C_2$-$C_{60}$ heteroaryl group. If two or more substituents are present, the substituents may be identical to or different from each other. The number of substituents is limited by the number of available valences of X.

For example, the term "substituted X" used herein refers to X in which a hydrogen atom of X is substituted with a deuterium atom; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_2$-$C_{20}$ alkenyl group; a $C_2$-$C_{20}$ alkynyl group; a $C_1$-$C_{20}$ alkoxy group; a $C_1$-$C_{20}$ alkyl group, a $C_2$-$C_{20}$ alkenyl group, a $C_2$-$C_{20}$ alkynyl group, and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof; a $C_3$-$C_{20}$ cycloalkyl group; a $C_3$-$C_{20}$ cycloalkenyl group; a $C_5$-$C_{20}$ aryl group; a $C_5$-$C_{20}$ aryloxy group; a $C_2$-$C_{20}$ heteroaryl group; a $C_3$-$C_{20}$ cycloalkyl group, a $C_3$-$C_{20}$ cycloalkenyl group, a $C_5$-$C_{20}$ aryl group, a $C_5$-$C_{20}$ aryloxy group, and a $C_2$-$C_{20}$ heteroaryl group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a $C_1$-$C_{20}$ alkyl group, and a $C_1$-$C_{20}$ alkoxy group; —N($Q_{101}$)($Q_{102}$); or —Si($Q_{103}$)($Q_{104}$)($Q_{105}$). In this regard, $Q_{101}$ through $Q_{105}$ may each independently be hydrogen, a halogen atom, a hydroxyl group, a cyano group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, or a substituted or unsubstituted $C_2$-$C_{60}$ heteroaryl group. If two or more substituents are present, the substituents may be identical to or different from each other. Again, the number of substituents is limited by the number of available valences of X.

The unsubstituted $C_1$-$C_{60}$ alkyl group has a linear or branched structure. Examples of the unsubstituted $C_1$-$C_{60}$ alkyl group include methyl, ethyl, propyl, isobutyl, sec-butyl, pentyl, iso-amyl, hexyl, heptyl, octyl, and nonyl. A detailed description of the substituent of the substituted $C_1$-$C_{60}$ alkyl group is already provided in the description of the "substituted X" above.

The unsubstituted $C_2$-$C_{60}$ alkenyl group denotes a terminal group containing at least one carbon double bond in the middle or at the end of the unsubstituted $C_2$-$C_{60}$ alkyl group. Examples of the unsubstituted $C_2$-$C_{60}$ alkenyl group may include ethenyl, prophenyl, butenyl, pentenyl, hexenyl, heptenyl, octenyl, propadienyl, isoprenyl, and allyl. A detailed description of the substituent of the substituted $C_2$-$C_{60}$ alkenyl group is already provided in the description of the "substituted X" above.

The unsubstituted $C_2$-$C_{60}$ alkynyl group denotes a terminal group containing at least one carbon triple bond in the middle or at the end of the unsubstituted $C_2$-$C_{60}$ alkyl group. For example, the unsubstituted $C_2$-$C_{60}$ alkynyl group may be acetylenyl. A detailed description of the substituent of the substituted $C_2$-$C_{60}$ alkynyl group is already provided in the description of the "substituted X" above.

The unsubstituted $C_1$-$C_{60}$ alkoxy group has Formula of —OY (Y is the unsubstituted $C_1$-$C_{60}$ alkyl group) and may be, for example, methoxy, ethoxy, isopropyloxy, butoxy, or pentoxy. A detailed description of the substituent of the substituted $C_1$-$C_{60}$ alkoxy group is already provided in the description of the "substituted X" above.

The unsubstituted $C_3$-$C_{60}$ cycloalkyl group denotes a ring-type saturated hydrocarbon group and may, for example, be cyclopropyl, cyclobutyl, cyclopentyl, cyclohexyl, or cyclooctyl. A detailed description of the substituent of the substituted $C_1$-$C_{60}$ cycloalkyl group is already provided in the description of the "substituted X" above.

The unsubstituted $C_3$-$C_{60}$ cycloalkenyl group denotes a ring-type unsaturated hydrocarbon group which has at least one carbon double bond and is not an aromatic ring. Examples of the unsubstituted $C_3$-$C_{60}$ cycloalkenyl group include cyclopropenyl, cyclobutenyl, cyclopentenyl, cyclohexenyl, cycloheptenyl, a 1,3-cyclohexadienyl group, a 1,4-cyclohexadienyl group, a 2,4-cycloheptadienyl group, and a 1,5-cyclooctadienyl group. A detailed description of the substituent of the substituted $C_3$-$C_{60}$ cycloalkenyl group is already provided in the description of the "substituted X" above.

The unsubstituted $C_5$-$C_{60}$ aryl group denotes a monovalent group having a $C_5$-$C_{60}$ carbocyclic aromatic system, wherein the monovalent group may be a monocyclic or polycyclic group. In the polycyclic group, at least two rings included therein may be fused with each other. Examples of the unsubstituted $C_5$-$C_{60}$ aryl group include phenyl, pentalenyl, indenyl, naphthyl, azulenyl, heptalenyl, indacenyl, acenaphthyl, fluorenyl, spiro-fluorenyl, phenalenyl, phenanthryl, anthryl, fluoranthenyl, triphenylenyl, pyrenyl, chrysenyl, naphthacenyl, picenyl, perylenyl, pentaphenyl, and hexacenyl. A detailed description of the substituent of the substituted $C_5$-$C_{60}$ aryl group is already provided in the description of the "substituted X" above.

The unsubstituted $C_2$-$C_{60}$ heteroaryl group denotes a monocyclic or polycyclic group including at least one ring and containing at least one heteroatom ((e.g., N, O, P, Si, or S). In the polycyclic group, at least two rings included therein may be fused with each other. Examples of the unsubstituted $C_2$-$C_{60}$ heteroaryl group include pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, triazolyl, tetrazolyl, oxadiazolyl, triazinyl, and benzooxazolyl. A detailed description of the substituent of the substituted $C_2$-$C_{60}$ heteroaryl group is already provided in the description of the "substituted X" above.

In the specification, "*" and "*'" denote a binding site with an atom of an adjacent moiety, and may be easily understood by those of ordinary skill in the art.

The polymer including the repeating unit of Formula 1 may be synthesized using a known organic synthesis method, such as Suzuki coupling or Yamamoto coupling. The synthesis method of the polymer may be easily understood by those of ordinary skill in the art with reference to Examples which will be described below.

The polymer includes the repeating unit of Formula 1 in which two carbazole-based condensed rings systems have a high triplet potential, and thus the polymer may have a high triplet state energy level. For example, the polymer including the repeating unit of Formula 1 wherein $Ar_1$ is a divalent linking group that satisfies the range of the dihedral angle α described above (e.g., Formulae 4B through 4K) may have a high triplet level of the two carbazole-based condensed rings systems that are linked to each other via $Ar_1$, thereby having a high triplet state energy level.

In addition, when the polymer further includes the additional repeating unit of Formula 2, the polymer may have a high triplet state energy level and a wide energy band gap even when a conjugation length of the polymer is increased.

Moreover, the repeating unit of Formula 1 may have hole transport properties and the additional repeating unit of Formula 2 may have electron transport properties. Thus the polymer may be a bipolar polymer in which both the hole transport moiety and the electron transport moiety are present in the main backbone. Therefore, when the polymer described above is used, the balance between the hole and electron transport may be effectively obtained and maintained.

Accordingly, the polymer may be used as a material for forming an organic layer of an OLED. For example, the polymer may be used as a phosphorescent host which is used in an emission layer of an OLED together with a phosphorescent dopant.

As compared with a fluorescent material that has a maximum internal quantum efficiency of 25% since only singlet state energy contributes to light emission, a phosphorescent material in which intersystem crossing between a singlet state energy level and a triplet state energy level is possible has a theoretical internal quantum efficiency of 100% because exciton having triplet state energy also contributes to light emission. Therefore, an OLED including the phosphorescent material may have a high efficiency. Accordingly, considering the characteristics of the polymer described above and the fact that a known phosphorescent dopant generally has a high triplet state energy level, the polymer may be used as a phosphorescent host in an EML of an OLED.

For example, the polymer may be used as red, green, and/or blue phosphorescent host in an EML of an OLED. The polymer may be used as red and/or green phosphorescent host in an EML of an OLED, but is not limited thereto.

According to another embodiment, an OLED includes a substrate; a first electrode; a second electrode; and an organic layer that is interposed between the first electrode and the second electrode and includes the polymer comprising the repeating unit of Formula 1.

The organic layer may include an EML, and the EML may include the polymer.

The EML may further include a phosphorescent dopant, and in particular a phosphorescent dopant for which the polymer may be a phosphorescent host.

The phosphorescent dopant may be a known phosphorescent dopant. For example, the phosphorescent dopant may be an organometallic complex including iridium (Ir), platinum (Pt), osmium (Os), rhenium (Re), titanium (Ti), zirconium (Zr), and hafnium (Hf), but is not limited thereto.

For example, the phosphorescent dopant may be bisthienylpyridine acetylacetonate iridium, bis(benzothienylpyridine) acetylacetonate iridium, bis(2-phenylbenzothiazole) acetylacetonate iridium, bis(1-phenylisoquinoline) iridium acetylacetonate, tris(1-phenylisoquinoline) iridium, tris(phenylpyridine) iridium, tris(2-biphenylpyridine) iridium, tris(3-biphenylpyridine) iridium, tris(4-biphenylpyridine) iridium, $Ir(pq)_2(acac)$ (wherein "pq" is an abbreviation for 2-phenylquinoline, and "acac" is an abbreviation for acetylacetone, see Compound 10 below), $Ir(ppy)_3$ (wherein "ppy" is an abbreviation for phenylpyridine, see Compound 11 below), platinum(II)octaethylporphyrin ("PtOEP", see a compound below), Compound 12 below, Firpic (see Compound 13 below), $Ir(piq)_3$ (see a compound below), $Ir(piq)_2$acac (wherein "piq" is an abbreviation for penylisoquinoline, see Compound 14 below), $Ir(mppy)_3$ (see Compound 15 below), $Btp_2Ir(acac)$ (see a compound below), $F_2Irpic$ (see a compound below), $(F_2ppy)_2Ir(tmd)$ (see a compound below), and $Ir(dfppz)_3$ (see a compound below), but is not limited thereto:

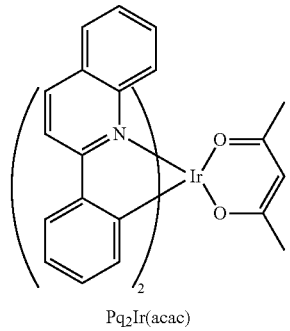

Compound 10

Pq2Ir(acac)

-continued
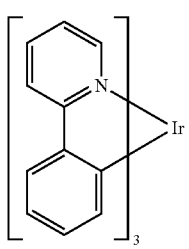
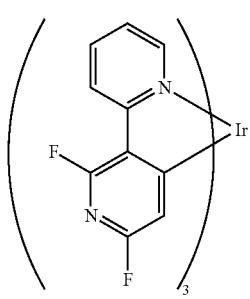
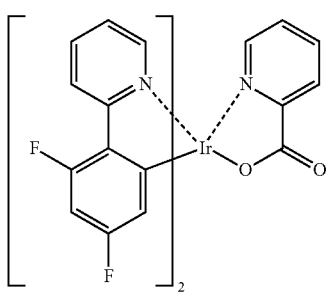
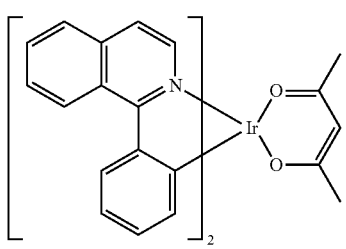
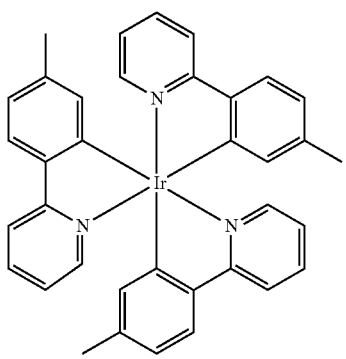
-continued
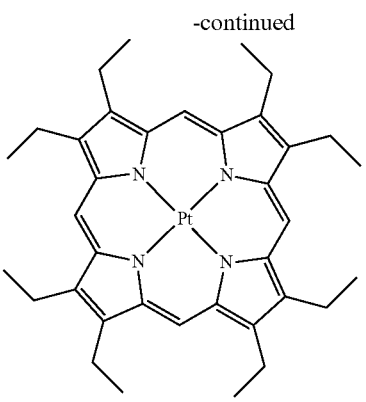
PtOEP
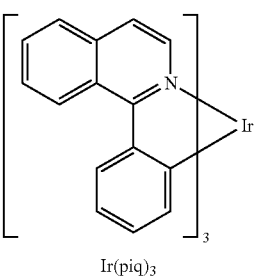
Ir(piq)₃
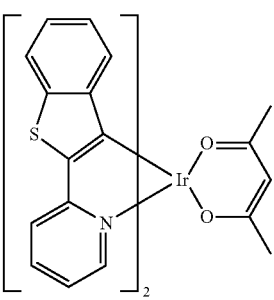
Btp₂Ir(acac)
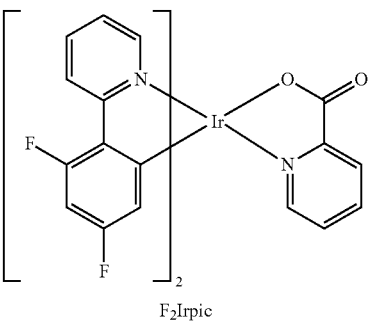
F₂Irpic
Compound 11
Compound 12
Compound 13
Compound 14
Compound 15

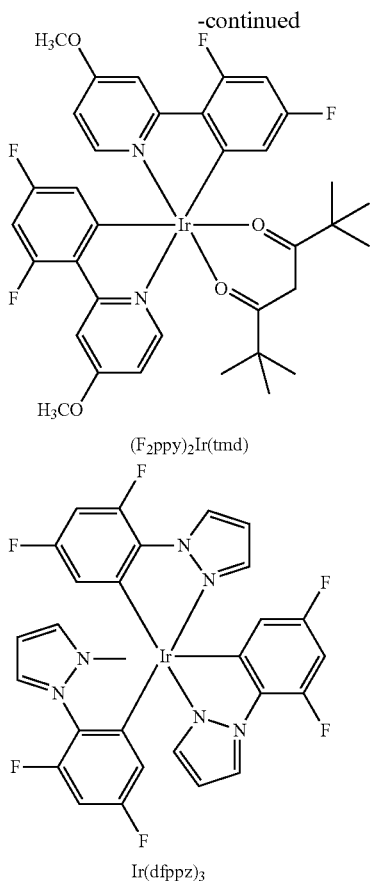

(F₂ppy)₂Ir(tmd)

Ir(dfppz)₃

The organic layer interposed between the first electrode and the second electrode may further include a hole injection layer ("HIL"), a hole transport layer ("HTL"), a hole blocking layer ("HBL"), an electron transport layer ("ETL"), and an electron injection layer ("EIL"), in addition to the EML described above.

FIG. 1 is a schematic cross-sectional view of an OLED 10 according to an embodiment. Referring to FIG. 1, the OLED 10 includes a substrate 11, a first electrode 12, a HTL 13, an EML 15, an ETL 16, an EIL 18, and a second electrode 19. The OLED 10 and a method of manufacturing the same will now be described in more detail.

First, a first electrode-forming material that has a high work function is deposited, ion-plated, plated, or sputtered on the substrate 11 to form the first electrode 12. The first electrode 12 may constitute an anode that injects holes or a cathode that injects electrons. The substrate 10, which may be any substrate that is used in general organic light-emitting devices, may be a glass substrate or a transparent plastic substrate with excellent mechanical strength, thermal stability, transparency, surface smoothness, ease of handling, and waterproofness. Examples of the first electrode-forming material include a metal oxide, a metal sulfide, and a metal, all of which have a high electrical conductivity. In general, these materials are used to form a thin film. Examples of the first electrode-forming material include indium oxide, zinc oxide, tin oxide, combinations thereof (e.g., indium tin oxide ("ITO") and indium zinc oxide ("IZO")), gold (Au), platinum (Pt), silver (Ag), and copper (Cu). In addition, polyaniline or a derivative thereof, or polythiophene or a derivative thereof may also be used as the first electrode-forming material. The first electrode 12 may have a single-layered structure or a multilayered structure including at least two layers. The first electrode 12 may include at least two different materials. The thickness of the first electrode 12 may be appropriately adjusted by considering light transmittance and electrical conductivity, for example, in the range of about 10 nanometers ("nm") to about 10 micrometers ("μm").

Next, although not illustrated in FIG. 1, if the first electrode 12 is an anode, a hole injection layer ("HIL") may be further formed on the first electrode 12. The HIL may be formed by vacuum deposition, spin coating, casting, inkjet printing, or Langmuir-Blodgett ("LB") deposition.

When the HIL is formed using vacuum deposition, the deposition conditions may vary with regard to the material that is used to form the HIL, and the structure and thermal properties of the HIL to be formed. In general, however, conditions for vacuum deposition may include a deposition temperature of about 100 to about 500 degrees Celsius ("° C."), a vacuum pressure of about $10^{-8}$ to about $10^{-3}$ torr, and a deposition rate of about 0.01 to about 100 Ångstrom per second ("Å/sec").

When the HIL is formed by spin coating, coating conditions may vary with regard to a compound that is used to form the HIL, and the desired structure and thermal properties of the HIL to be formed. In general, however, the coating speed may be in the range of about 2,000 revolutions per minute ("rpm") to about 5,000 rpm, and a temperature for heat treatment, which is performed to remove a solvent after coating, may be in the range of about 80 to about 300° C.

A material for forming the HIL may be a known hole injection material. Examples of the known hole injection material include phthalocyanine compounds such as copper phthalocyanine, 4,4',4"-tris (3-methylphenylphenylamino) triphenylamine (m-MTDATA), N,N'-di(1-naphthyl)-N,N'-diphenylbenzidine (NPB), TDATA (see a formula below), and 2T-NATA (see a formula below), but are not limited thereto.

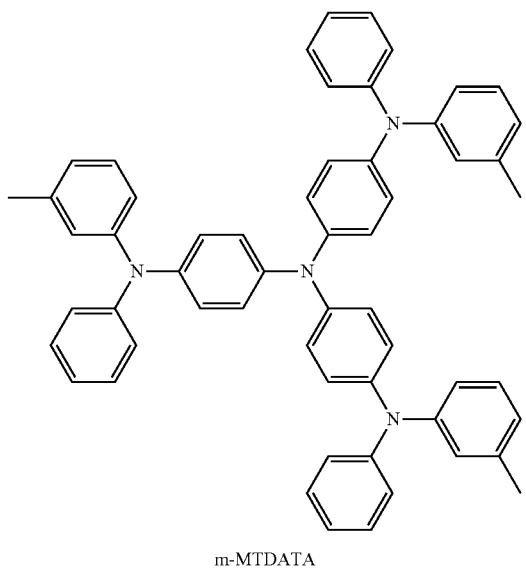

m-MTDATA

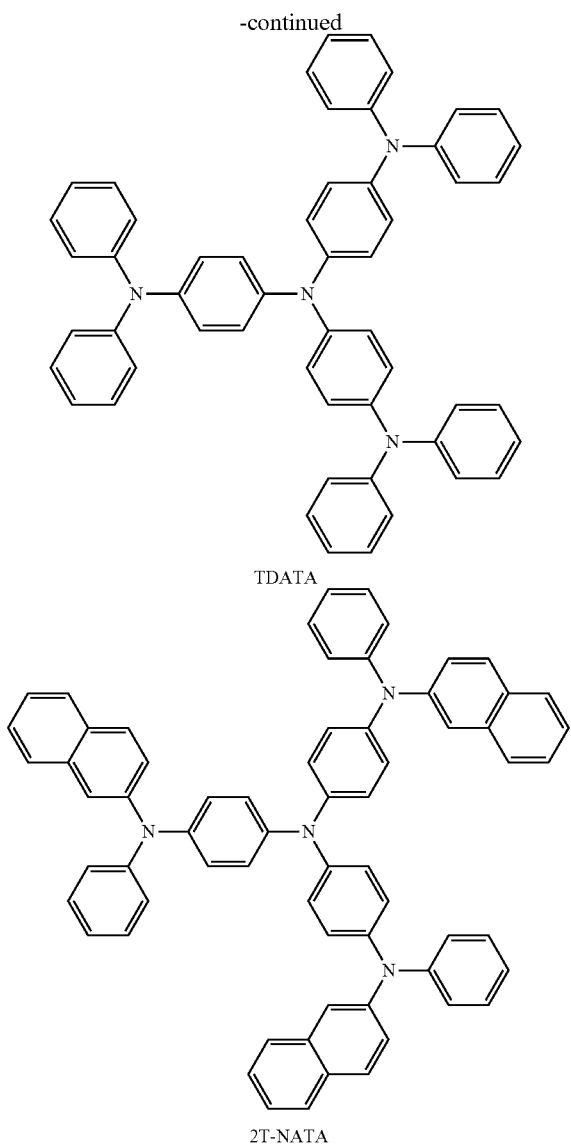

TDATA

2T-NATA

The thickness of the HIL may be in the range of about 100 to about 10,000 Å, specifically, in the range of about 100 to about 1,000 Å. When the thickness of the HIL is within this range, the HIL may have excellent hole injection properties without an increase in driving voltage.

Next, the HTL 13 may be formed on the first electrode 12 or the HIL by vacuum deposition, spin coating, casting, inkjet printing, or LB deposition.

When the HTL 13 is formed by vacuum deposition or spin coating, the deposition and coating conditions vary with regard to the compound used. In general, however, the condition may be almost the same as the condition for forming the HIL.

A material for forming the HTL 13 may be a known hole transporting material. Examples of the known hole transporting material include an amine derivative having an aromatic condensed ring, such as N,N'-bis(3-methylphenyl)-N,N'-diphenyl-[1,1-biphenyl]-4,4'-diamine ("TPD"); polyaniline/dodecylbenzenesulfonic acid ("Pani/DBSA", see a formula below); poly(3,4-ethylenedioxythiophene)/poly(4-styrenesulfonate) ("PEDOT/PSS", see a formula below); polyaniline/camphor sulfonic acid ("Pani/CSA"); and polyaniline/poly(4-styrenesulfonate) ("PANI/PSS"), but are not limited thereto.

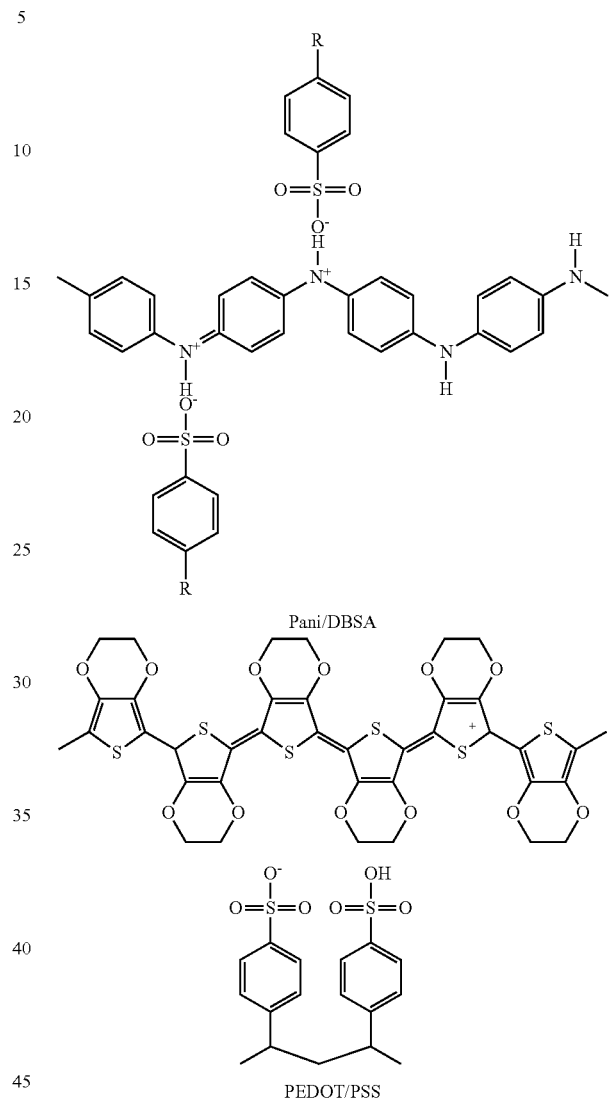

Pani/DBSA

PEDOT/PSS

The thickness of the HTL 13 may be in the range of about 50 to about 1,000 Å, specifically, in the range of about 100 to about 600 Å. When the thickness of the HTL 13 is within the foregoing ranges, the HTL 13 may have excellent hole transport properties without increase in driving voltage.

Next, the EML 15 may be formed on the HTL 13. The EML 15 may be formed by spin coating, casting, inkjet printing, or LB deposition. When the EML 15 is formed by spin coating, the coating condition may vary according to a used polymer and/or compound. In general, however, the condition may be almost the same as the condition for forming the HIL.

The EML 15 may include the polymer including the repeating unit of Formula 1 described above as a host. The EML 15 may further include a phosphorescent dopant. Examples of the phosphorescent dopant are already described above.

If the EML 15 includes the polymer as a host and the phosphorescent dopant, the amount of the phosphorescent dopant in the EML 15 may be in the range of about 1 weight percent ("wt %") to about 10 wt % based on 100 wt % of the EML 15. When the amount of the phosphorescent dopant is within this range, concentration quenching may be substantially prevented.

The EML 15 may include only the polymer including the repeating unit of Formula 1 described above, or may further include a known fluorescent dopant, in addition to the polymer.

The thickness of the EML 15 may be in the range of about 100 to about 1,000 Å, specifically, in the range of about 200 to about 900 Å. When the thickness of the EML 15 is within this range, the EML 15 may have excellent light emission characteristics without an increase in driving voltage.

Although not illustrated in FIG. 1, a hole blocking layer may be further formed on the EML 15, if necessary.

The HBL may prevent triplet excitons or holes in the EML 15 from diffusing into the second electrode 19. The HBL may be formed by vacuum deposition, spin coating, casting, or LB deposition. When the HBL is formed by vacuum deposition or spin coating, the deposition and coating conditions vary according to a used compound. In general, however, the conditions may be almost the same as the condition for forming the HIL. Examples of a known hole blocking material include an oxadiazole derivative, a triazole derivative, a phenanthroline derivative, and TAZ (see a formula below), but are not limited thereto.

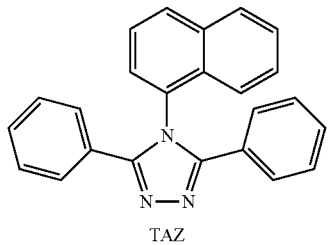 [SMILES: c1ccc(-c2nnc(-c3ccccc3)n2-c2cccc3ccccc23)cc1]

TAZ

The thickness of the HBL may be in the range of about 50 to about 1,000 Å, specifically, in the range of about 100 to about 300 Å. When the thickness of the HBL is within these ranges, the HBL may have satisfactory hole blocking properties.

Next, the ETL 16 may be formed on the EML 15 or the HBL by vacuum deposition, spin coating, or casting. When the ETL 16 is formed by vacuum deposition or spin coating, the deposition and coating conditions vary with regard to the compound used. In general, however, the conditions may be almost the same as the conditions for forming the HIL. Examples of a material for forming the ETL 16 include any known materials that stably transport electrons injected from an electron injection electrode, i.e., a cathode, such as a quinoline derivative, 4,7-diphenyl-1,10-phenanthroline ("Bphen"), BAlq (see a formula below), tris(8-quinolinorate)aluminum ("Alq$_3$"), beryllium bis(benzoquinolin-10-olate ("Bebq$_2$"), and TPBi (see a formula below).

BAlq

TPBi

The thickness of the ETL 16 may be in the range of about 100 to about 1,000 Å, specifically, in the range of about 200 to about 500 Å. When the thickness of the ETL 16 is within these ranges, the ETL 16 may have satisfactory electron transport properties without an increase in driving voltage.

Next, the EIL 18 may be formed on the ETL 16 or the EML 15. The EIL 18 may be formed from any known material, such as LiF, NaCl, CsF, Li$_2$O, BaO, or BaF$_2$.

The deposition conditions for the EIL 18 may vary according to a used compound. In general, however, the conditions may be almost the same as the conditions for forming the HIL.

The thickness of the EIL 18 may be in the range of about 1 to about 100 Å, specifically, in the range of about 5 to about 50 Å. When the thickness of the EIL 18 is within these ranges, the EIL 18 may have satisfactory electron injection properties without an increase in driving voltage.

Lastly, the second electrode 19 may be formed on the EIL 19. The second electrode 19 may be formed using the same method as that used to form the first electrode 12. The second electrode 19 may be a cathode or an anode. When the second electrode 19 is a cathode, the second electrode 19 may be formed from a material having a low work function. Examples of the material forming the second electrode 19 include an alkali metal, such as lithium (Li), sodium (Na), potassium (K), rubidium (Rb), and cesium (Cs); an alkali earth metal, such as beryllium (Be), magnesium (Mg), calcium (Ca), strontium (Sr), and barium (Ba); a metal, such as aluminum (Al), scandium (Sc), vanadium (V), zinc (Zn), yttrium (Y), indium (In), cerium (Ce), samarium (Sm), europium (Eu), terbium (Tb), and ytterbium (Yb); alloys of at least two of these metals; alloys of these metals with gold (Au), silver (Ag), platinum (Pt), copper (Cu), manganese (Mg), titanium (Ti), cobalt (Co), nickel (Ni), tungsten (W), and tin (Sn); graphite; and graphite intercalation compound. Examples of the alloys include a Mg—Ag alloy, a Mg—In alloy, a Mg—Al alloy, an In—Ag alloy, a Li—Al alloy, a Li—Mg alloy, a Li—In alloy, and a Ca—Al alloy. The second electrode 19 may have a single-layered structure or a multilayered structure including at least two layers. In addition, a material for forming the second electrode 19 may be used either alone or in combination with at least two other materials. The second electrode 19 may be a transparent, semitransparent, or reflective electrode. The thickness of the second electrode 19 may be in the range of about 10 nm to about 10 μm, but is not limited thereto.

One or more embodiments will now be described in more detail with reference to the following Examples. These Examples are for illustrative purposes only and are not intended to limit the scope of the invention.

EXAMPLE

Synthesis Example 1

Synthesis of Monomer 1

Monomer 1 was synthesized according to Reaction Scheme 1 below:

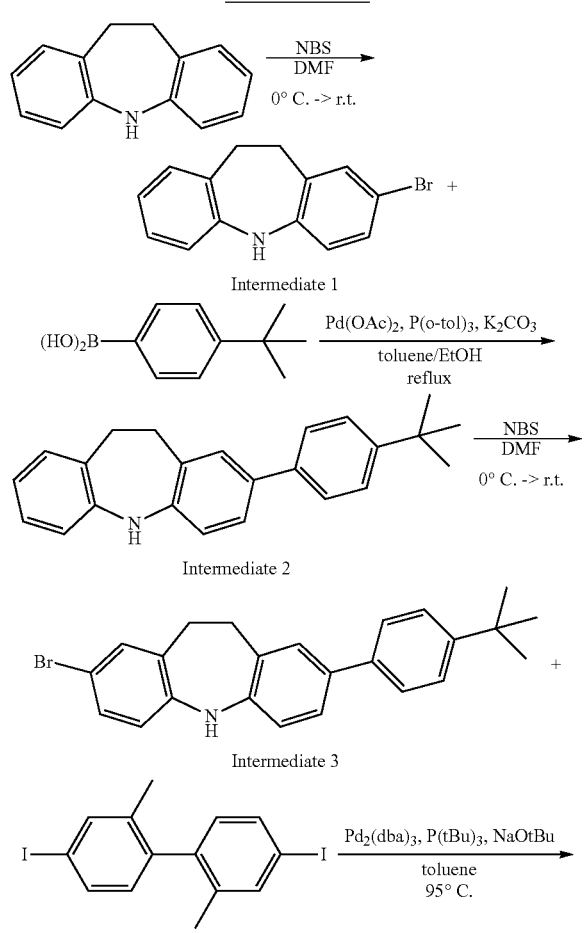

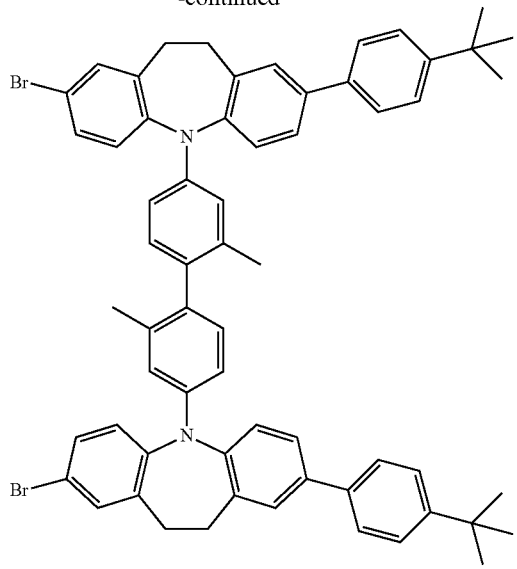

Monomer 1

Synthesis of Intermediate 1.

A mixture of 20 g (112.7 mmol) of N-bromosuccinimide ("NBS") and 50 ml of DMF was slowly added to a mixture of 20.0 g (102.4 mmol) of iminodibenzyl and 50 ml of dimethylformamide (DMF), and the resultant mixture was stirred at room temperature (about 25° C.) to obtain 18 g of Intermediate 1 (yield: 64%).

$^1$H-NMR (CDCl$_3$, 300 MHz): δ (ppm) 7.19-7.06 (m, 4H), 6.85-6.72 (m, 2H), 6.63-6.61 (d, 1H), 5.99 (bs, 1H), 3.11-3.03 (t, 4H).

Synthesis of Intermediate 2.

A mixture of 3.44 g (19.3 mmol) of t-butylphenylboronic acid, 4.41 g (16.1 mmol) of Intermediate 1, 184 mg (0.8045 mmol) of palladium acetate (Pd(OAc)$_2$), 1.26 g (4.023 mmol) of tri(o-tolyl)phosphine ((P(o-tol)$_3$), 16 ml of a 2.0 M K$_2$CO$_3$ aqueous solution, 135 ml of toluene, and 20 ml of ethanol (EtOH) was stirred at 100° C. to obtain 6.7 g of Intermediate 2 (yield: 79%).

$^1$H-NMR (CDCl$_3$, 300 MHz): δ (ppm) 7.52-7.42 (m, 4H), 7.33-7.23 (m, 4H), 6.84-6.74 (m, 3H), 6.07 (s, 1H), 3.18-3.12 (m, 4H), 1.55 (s, 9H).

Synthesis of Intermediate 3.

A mixture of 1.91 g (10.74 mmol) of NBS and 20 ml of DMF was slowly added to a mixture of 2.93 g (8.948 mmol) of Intermediate 2 and 20 ml of DMF, and the resultant mixture was stirred at room temperature (about 25° C.) to obtain 2.5 g of Intermediate 3 (yield: 70%).

$^1$H-NMR (CDCl$_3$, 300 MHz): δ (ppm) 7.52-7.43 (m, 4H), 7.36-7.18 (m, 4H), 6.82-6.78 (d, 1H), 6.67-6.61 (d, 1H), 6.06 (s, 1H), 3.17-3.04 (m, 4H), 1.38 (s, 9H).

Synthesis of Monomer 1.

A mixture of 696 mg (1.7155 mmol) of 4,4'-diiodo-1,1'-biphenyl, 1.39 g (3.431 mmol) of Intermediate 3, 31 mg (0.03431 mmol) of tris(dibenzylideneacetone)dipalladium (0)(Pd$_2$(dba)$_3$), 151 mg (0.06862 mmol) of tri-tert-butyl phosphine (P(t-Bu)$_3$), 330 mg (3.431 mmol) of NaOtBu, and 50 ml of toluene was stirred at 110° C. to obtain 1.3 g of Monomer 1 (yield: 79%).
$^1$H-NMR (300 MHz, CDCl$_3$): δ (ppm) 7.56-6.80 (m, 28H), 3.06 (m, 8H), 1.39 (s, 18H).
Synthesis Example 2
Synthesis of Polymer P1
Polymer P1 (alternating polymer) was synthesized according to Reaction Scheme 2 below:
Reaction Scheme 2
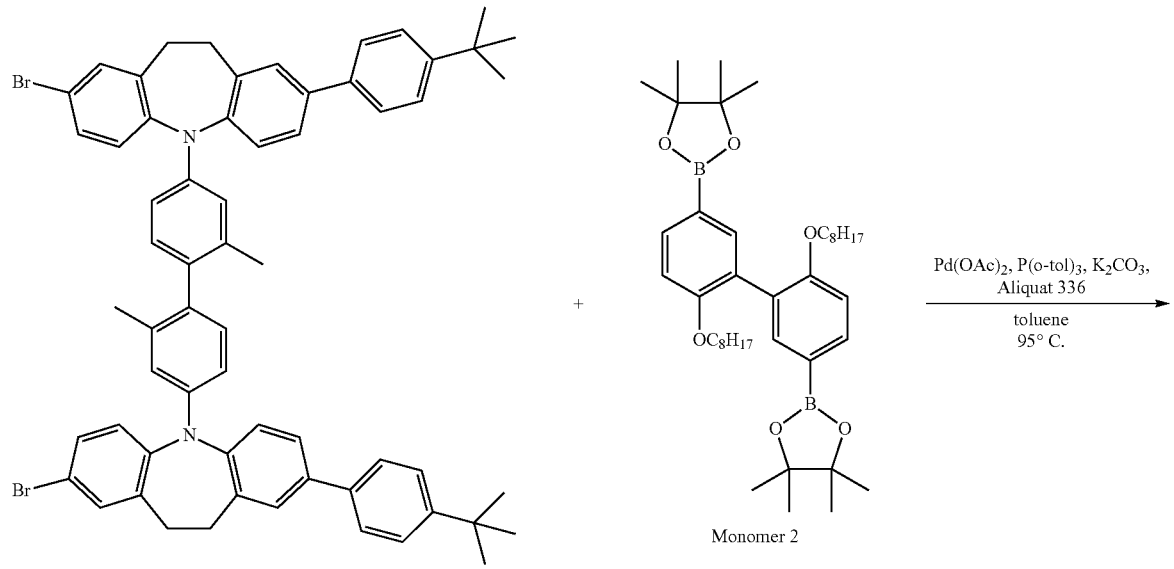
Monomer 1
Monomer 2
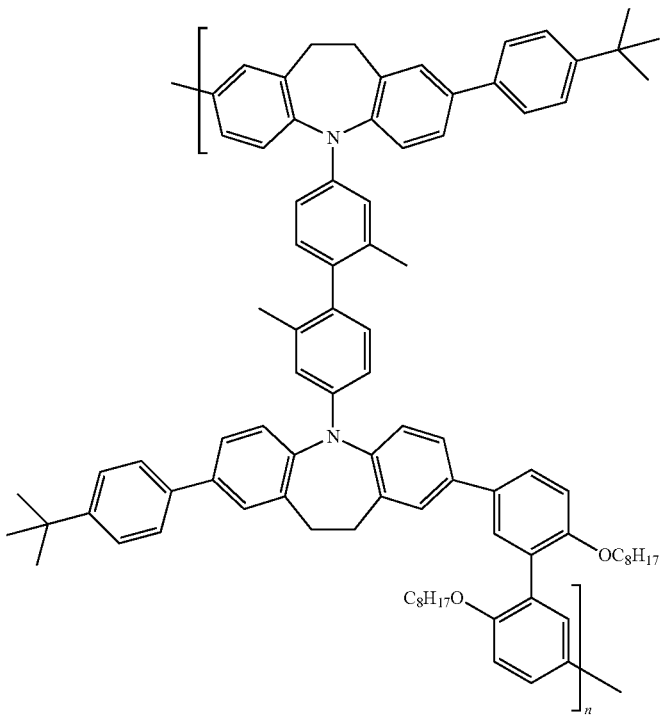
Polymer P1

Synthesis of Polymer P1

A mixture of 500 mg (0.5193 mmol) of Monomer 1 synthesized according to Synthesis Example 1, 344 mg (0.5193 mmol) of Monomer 2, 5.8 mg (0.0260 mmol) of Pd(OAc)$_2$, 40 mg (0.1298 mmol) of P(o-tol)$_3$, 4 ml (7.790 mmol) of K$_2$CO$_3$ (2.0 M in H$_2$O), Aliquat(R) 336 (200 μl, 2.0 M in toluene), and 6 ml of toluene was stirred at 100° C. to obtain 750 mg of Polymer P1.

GPC: Mw=3.86×10$^3$, Mn=2.12×10$^3$, PDI=1.8

Synthesis Example 3

Synthesis of Polymer P2

Polymer P2 (alternating polymer) was synthesized according to Reaction Scheme 3 below:

Reaction Scheme 3

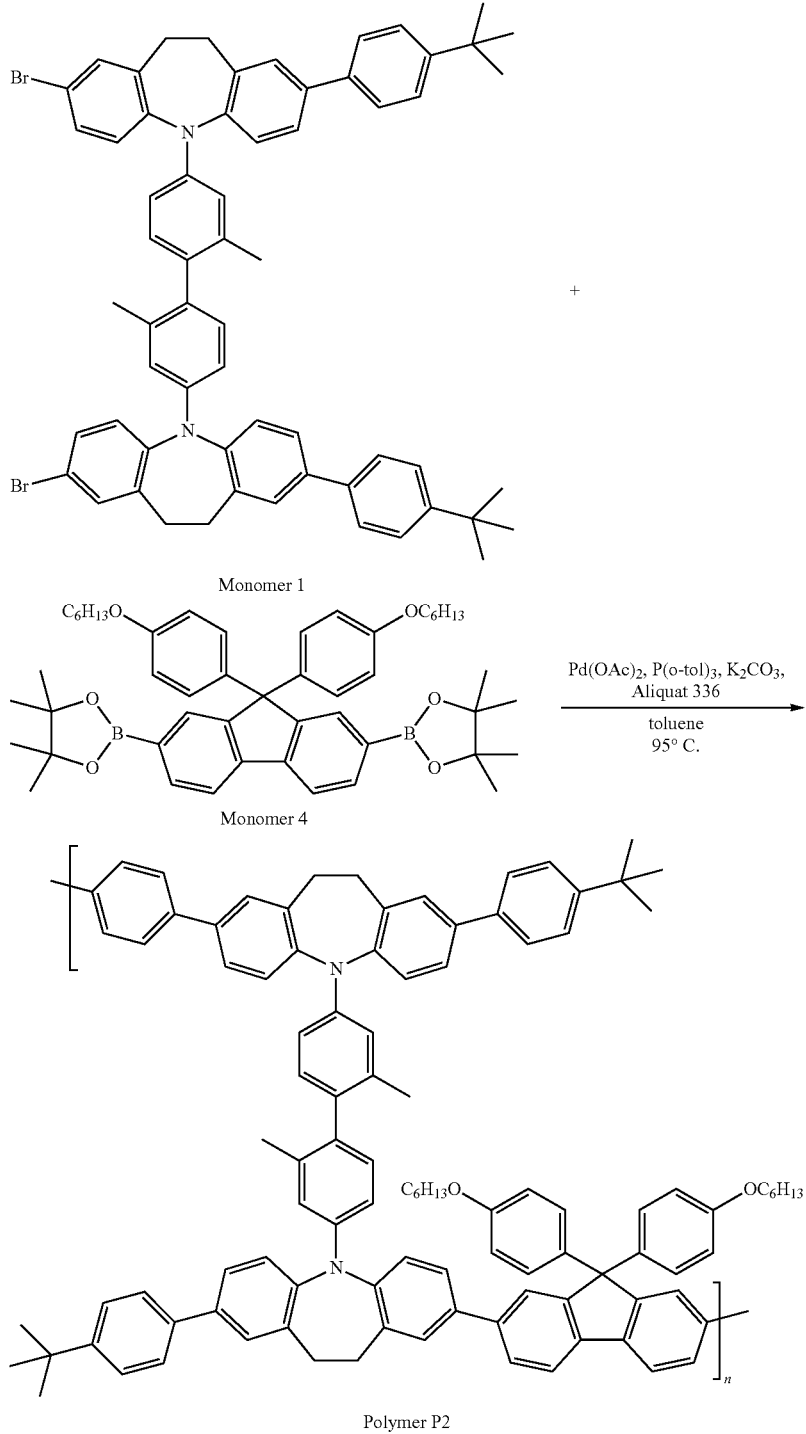

A mixture of 500 mg (0.5193 mmol) of Monomer 1 of Synthesis Example 1, 400 mg (0.5193 mmol) of Monomer 4, 5.8 mg (0.0260 mmol) of Pd(OAc)$_2$, 40 mg (0.1298 mmol) of P(o-tol)$_3$, 4 ml (7.790 mmol) of K$_2$CO$_3$ (2.0M in H$_2$O), Aliquat(R) 336 (200 μl, 2.0 M in toluene), and 6 ml of toluene was stirred at 100° C. to obtain 804 mg of Polymer P2.

GPC: Mw=2.89×10$^3$, Mn=1.91×10$^3$, PDI=1.5

Synthesis Example 4

Synthesis of Polymer P3

Polymer P3 (random polymer) was synthesized according to Reaction Scheme 4 below:

Reaction Scheme 4

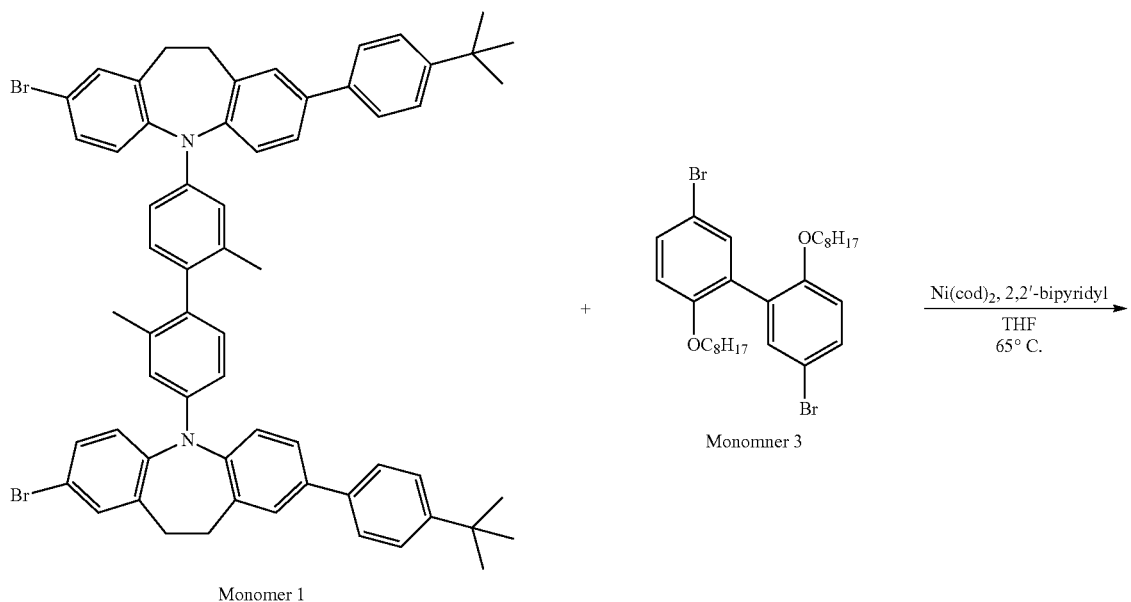

Monomer 1

Monomner 3

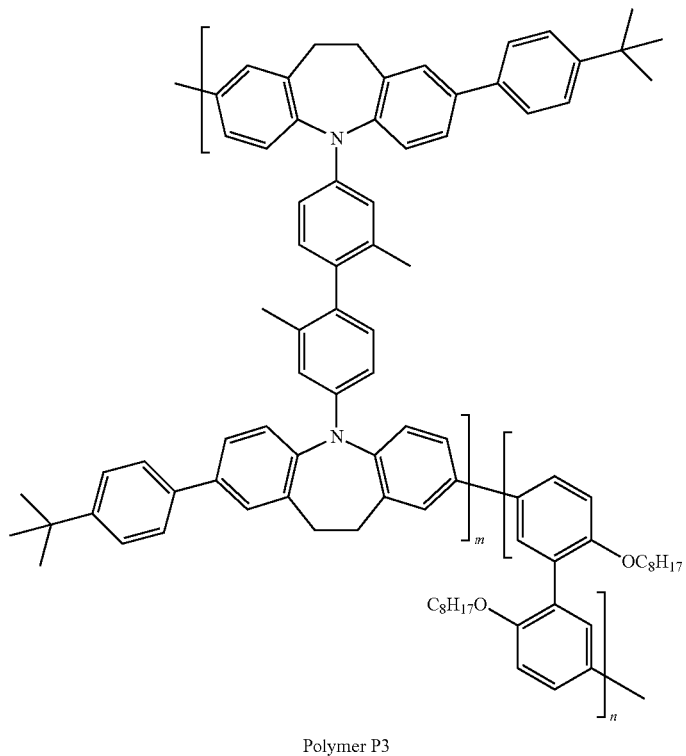

Polymer P3

A mixture of 400 mg (0.4037 mmol) of Monomer 1, 229 mg (0.4029 mmol) of Monomer 3, 554 mg (2.0145 mmol) of Ni(cod)$_2$ (cod=1,5-cyclooctadiene), 315 mg (2.0145 mmol) of 2,2'-bipyridyl, and 10 ml of THF was stirred at 60° C. to obtain 500 mg of Polymer P3.

GPC: Mw=7.34×10$^3$, Mn=1.84×10$^3$, PDI=3.9

Evaluation Example 1

Evaluation of Light-Emitting Properties of Polymers (in Solution)

Light-emitting properties of Polymer P3 were evaluated using photoluminescence spectrum of Polymer P3. First, Polymer P3 was diluted in toluene to a concentration of 10 mM, and the PL spectrum of Polymer P3 was measured using an ISC PC1 Spectrofluorometer equipped with a Xenon lamp. The results are illustrated in FIG. 2.

Figure 2:
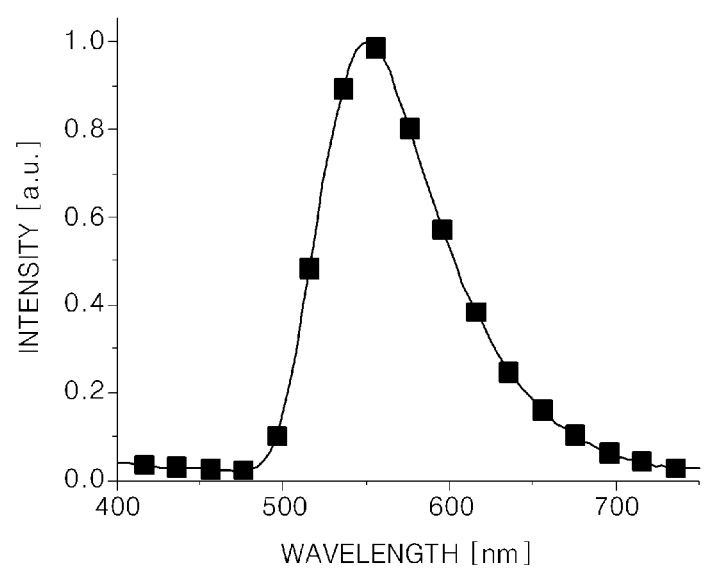
FIG. 2 is a graph showing photoluminescence ("PL") spectrum of a polymer P3 solution, according to an exemplary embodiment.

The results illustrated in FIG. 2 confirm that Polymer P3 in solution exhibited excellent light-emitting properties.

Evaluation Example 2

Evaluation of Energy Gap and Triplet State Energy of Polymer

Highest occupied molecular orbital (HOMO) energy levels and triplet state energy of Polymers P1, P2, and P3 were evaluated, and the results are shown in Table 1 below. The HOMO energy level was measured by cyclic voltammetry. The cyclic voltammetry was performed using a Princeton Applied Research EG&G potentiostat/galvanostat model 263 A equipped with a Pt wire as a pseudoreference electrode, a Pt wire as a counter electrode, and Pt (diameter of 2 mm) as a working electrode. Acetonitrile was used as a solvent, and 0.1 M TBAPF$_6$ was used a supporting electrolyte in all experiments. A 0.1 M ferrocene/ferrocenium ($F_c/F_c^+$) couple served as an internal standard, and all reported potentials were referenced to its reversible potential. The ionization potential of each polymer is approximately equal to the onset oxidation potential (vs. $F_c^+/F_c$) plus 4.8 eV (Fc+/Fc energy level below the vacuum level), which means that $E_{(HOMO)}$ can be calculated using the following equation: IP [eV]=$E_{onset}$+4.8 eV, which is the HOMO energy level ($E_{HOMO}$) of polymer. Meanwhile, the triplet state energy was measured such that a mixture of toluene and each Polymer (1 mg of each polymer was dissolved in 3 cc of toluene) were added to a quartz cell, liquid nitrogen (77° K) was added thereto, PL spectra of Polymers P1, P2 and P3 were measured using a PL measuring device, and the PL spectra thereof were compared with general room-temperature PL spectra, thereby analyzing peaks observed at only low temperatures.

TABLE 1

|  | Triplet state energy (ET) (eV) | HOMO energy level (eV, absolute value) |
| --- | --- | --- |
| Polymer P1 | 2.5 | 5.29 |
| Polymer P2 | 2.5 | 5.27 |
| Polymer P3 | 2.3 | 5.15 |

Example 1

A transparent electrode substrate formed by coating a glass substrate with 150 nm of indium-tin oxide was cleaned. Then, the ITO layer was patterned into a desired pattern by using a photosensitive resin and an etchant, followed by cleaning. A hole transport layer-forming composition (Batron P 4083, available from Bayer AG) containing 3,4-ethylenedioxythiopene ("PEDOT") was spin coated on the ITO layer and then baked at 200° C. for about 0.5 hours to form a HTL. An emission layer-forming composition (0.7 wt %) including chlorobenzene as a solvent, Polymer P3 as a host and Ir(mppy)$_3$ as a dopant (10 wt %) was spin coated on the HTL and baked at 120° C. for 30 minutes to form an EML including Polymer P3 and Ir(mppy)$_3$. The hole transport layer-forming composition and the emission layer-forming composition were filtered using a 0.2 mm filter before the spin coating processes. The concentrations and coating rates of the hole transport layer-forming composition and the emission layer-forming composition were adjusted to form a HTL having a thickness of 15 nm and an EML having a thickness of 50 nm. TPBi was vacuum-deposited on the EML at a vacuum pressure of 4×10$^{-6}$ torr or less to form an ETL having a thickness of 40 nm. Then, LiF and Al were sequentially deposited on the ETL to form an EIL having a thickness of 0.5 nm and a second electrode having a thickness of 100 nm, thereby completing the manufacture of an OLED. The thickness and growth rate of each of the layers were adjusted using a crystal sensor during the deposition process.

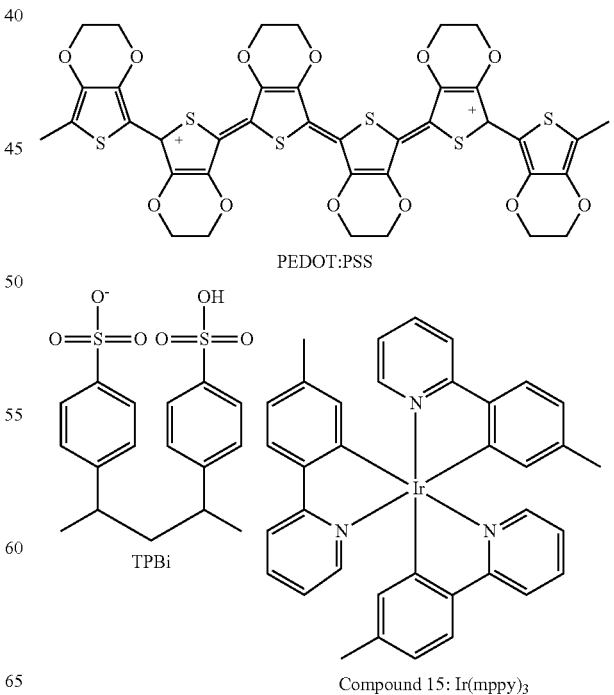

PEDOT:PSS

TPBi

Compound 15: Ir(mppy)$_3$

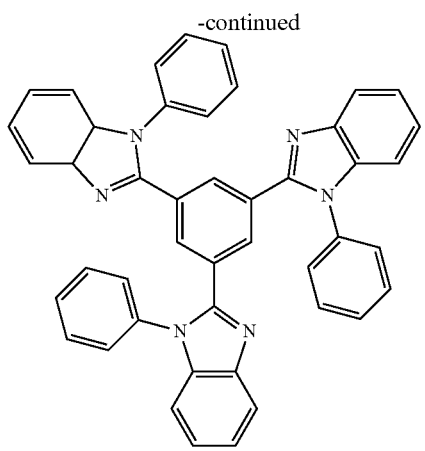

Comparative Example 1

An OLED was manufactured in the same manner as in Example 1, except that a mixture of PVK (number average molecular weight ("Mn"): from about 25,000 to about 50,000/PDI: 2) and CBP (weight ratio of PVK to CBP is 70:30) was used instead of Polymer P3 in the formation of the EML.

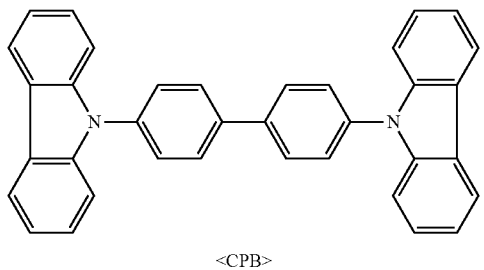 [SMILES: c1ccc2c(c1)c1ccccc1n2-c1ccc(-c2ccc(-n3c4ccccc4c4ccccc43)cc2)cc1]

<CPB>

Structures of the OLEDs manufactured according to Example 1 and Comparative Example 1 are shown in Table 2 below:

TABLE 2

| | Anode | HTL | EML | ETL | EIL/cathode |
|---|---|---|---|---|---|
| Example 1 | ITO (150 nm) | PEDOT:PSS (15 nm) | Polymer P3:Ir (mppy)$_3$ (10 wt %)[1] (50 nm) | TPBi (40 nm) | LiF (0.5 nm) /Al (100 nm) |
| Comparative Example 1 | ITO (150 nm) | PEDOT:PSS (15 nm) | PVK:CBP[1]:Ir (mppy)$_3$ (10 wt %)[2] (50 nm) | TPBi (40 nm) | LiF (0.5 nm) /Al (100 nm) |

[1] A weight ratio of PVK to CBP is 70:30.
[2] amount of Ir (mppy)$_3$ based on 100 wt % of the EML Evaluation Example 3

Characteristics Evaluation of OLED

Figure 3:
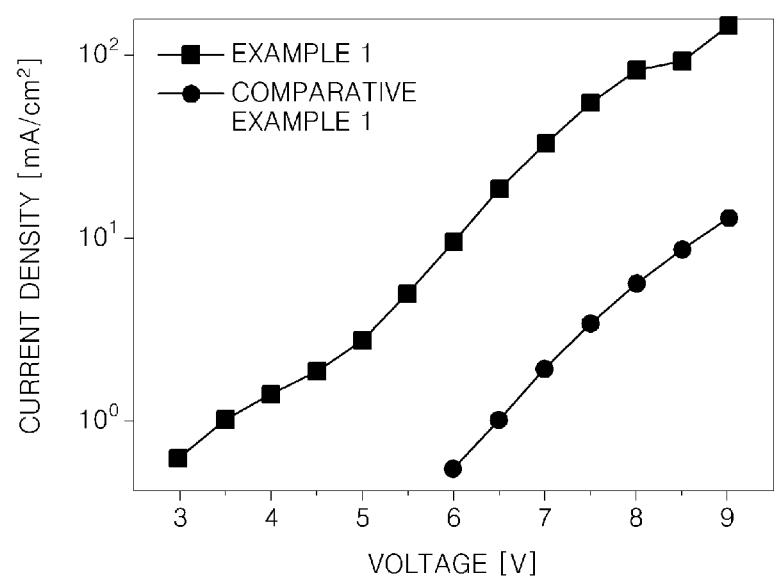
FIG. 3 is a graph showing voltage-current density characteristics of OLEDs manufactured according to Example 1 and Comparative Example 1.

Current density, current efficiency, and luminance of the OLED of Example 1 were evaluated using a PR650 Spectroscan Source Measurement Unit (available from PhotoResearch), and the results are illustrated in FIGS. 3 (graph showing voltage-current density characteristics) and 4 (graph showing voltage-luminance characteristics).

Figure 4:
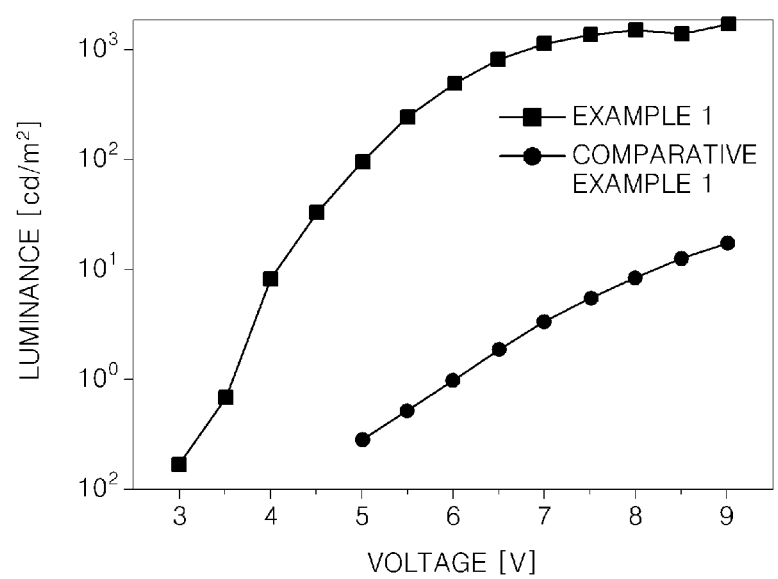
FIG. 4 is a graph showing voltage-luminance characteristics of the OLEDs of Example 1 and Comparative Example 1.

Referring to FIGS. 3 and 4, it is confirmed that the OLED of Example 1 including Polymer P3 has high current density, high current efficiency, and high luminance.

As described above, according to the one or more of the above embodiments, a polymer including a repeating unit of Formula 1 may have a high triplet state energy level and transport both holes and electrons. Therefore, an OLED including the polymer may have high current density and high luminance.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A polymer comprising a repeating unit represented by Formula 1 and an additional repeating unit represented by Formula 2:

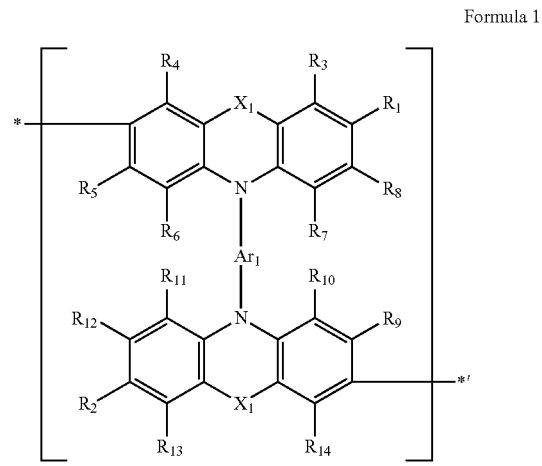

Formula 1 wherein $X_1$ is —[C($R_{20}$)($R_{21}$)]$_a$—, —Si($R_{22}$)($R_{23}$)—, —S—, or —O—, and a is an integer of 1 to 5;

$R_3$ through $R_{14}$ and $R_{20}$ through $R_{23}$ are each independently hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, a substituted or unsubstituted $C_2$-$C_{60}$ heteroaryl group, —N($Q_1$)($Q_2$), or —Si($Q_3$)($Q_4$)($Q_5$);

$Q_1$ through $Q_5$ are each independently hydrogen, deuterium, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_3$-$C_{60}$ cycloalkyl group, a $C_5$-$C_{60}$ aryl group, or a $C_2$-$C_{60}$ heteroaryl group;

$Ar_1$ is a divalent group having two substituted benzene rings that are linked to each other by a single bond, and a dihedral angle between the two substituted benzene rings is in a range of about 33° to about 82°; and $R_1$ and $R_2$ are each independently represented by any one Formulae 3A through 3I:

Formula 3A

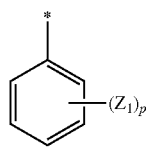

Formula 3B

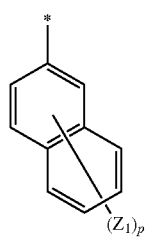

Formula 3C

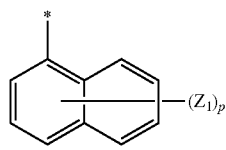

Formula 3D

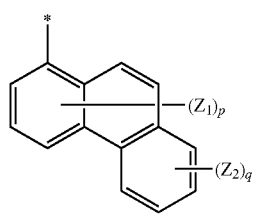

Formula 3E

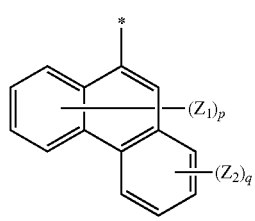

Formula 3F

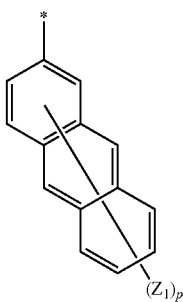

Formula 3G

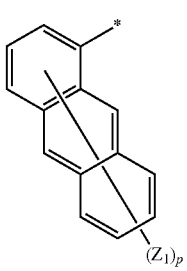

Formula 3H

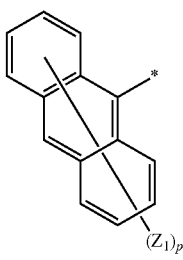

Formula 3I

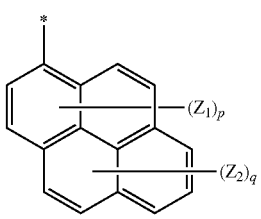

wherein $Z_1$ and $Z_2$ are each independently deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_2$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof;

p is an integer of 1 to 9; and q is an integer of 1 to 4, $$*\!-\!\!\![Ar_2]\!-\!\!\!*'$$

Formula 2 wherein $Ar_2$ is represented by any one of Formulae 5B-1, 5B-2, 5C-1, and 5E-1:

Formula 5B-1

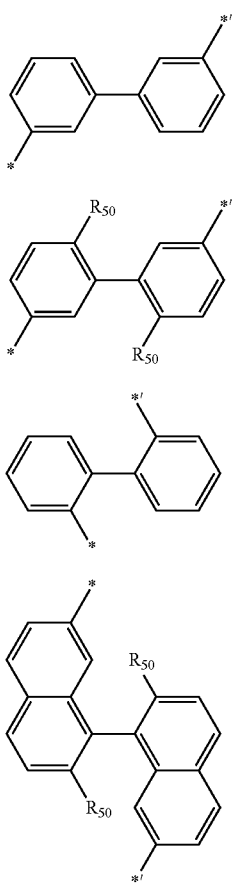

Formula 5B-2

Formula 5C-1

Formula 5E-1 wherein $R_{50}$ is a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof.

2. The polymer of claim 1, wherein $X_1$ is —[C($R_{20}$)($R_{21}$)]$_a$—, $R_{20}$ and $R_{21}$ are each independently hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a $C_1$-$C_{10}$ alkyl group, or a $C_1$-$C_{10}$ alkoxy group, and a is 1, 2 or 3.

3. The polymer of claim 1, wherein $R_3$ and $R_{14}$ are each independently hydrogen; deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; a $C_1$-$C_{20}$ alkyl group and a $C_1$-$C_{20}$ alkoxy group that are substituted with a deuterium atom, a halogen atom, a hydroxyl group, a cyano group, a nitro group an amino group, an amidino group, a hydrazine group, a hydrazone group, a carboxyl group or a salt thereof, an ester group, a sulfonic acid group or a salt thereof, and a phosphoric acid or a salt thereof.

4. The polymer of claim 1, wherein $Ar_1$ is represented by one of Formulae 4B through 4I:

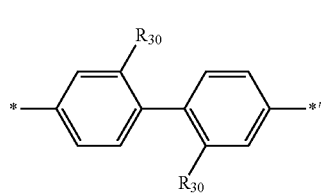

Formula 4B

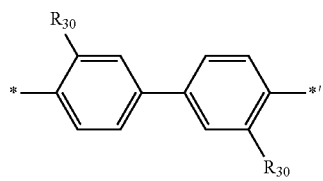

Formula 4C

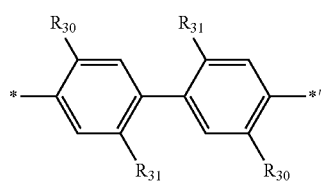

Formula 4D

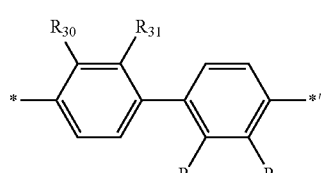

Formula 4E

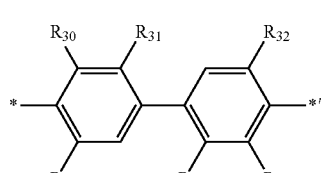

Formula 4F

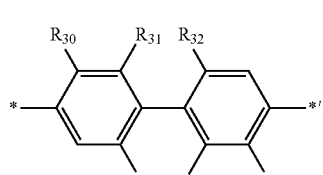

Formula 4G

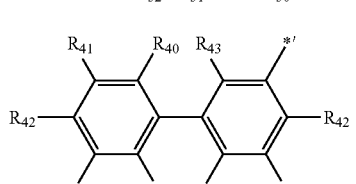

Formula 4H

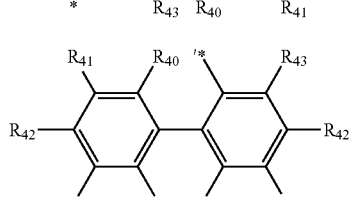

Formula 4I wherein $R_{30}$ through $R_{32}$ are each independently a deuterium atom; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof; and $R_{40}$ through $R_{43}$ are each independently hydrogen; deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof.

5. The polymer of claim 1, wherein
$R_1$ is same as $R_2$, $R_3$ is same as $R_{13}$, $R_4$ is same as $R_{14}$, $R_5$ is same as $R_9$, $R_6$ is same as $R_{10}$, $R_7$ is same as $R_{11}$ and $R_8$ is same as $R_{12}$.

6. The polymer of claim 1, wherein the repeating unit is represented by Formula 1 is represented by Formula 1A:

Formula 1A

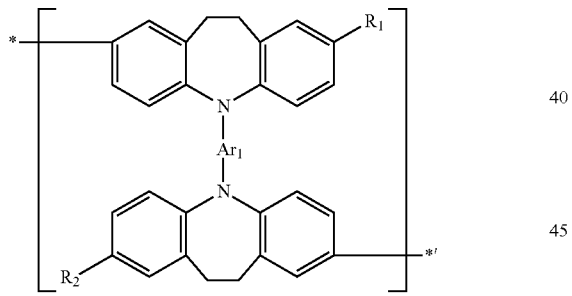

$Ar_1$ is represented by one of Formulae 4B through 4I:

Formula 4B

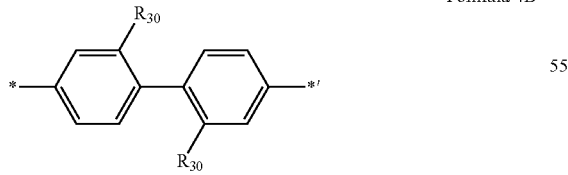

Formula 4C

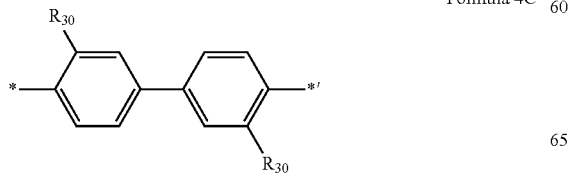

Formula 4D

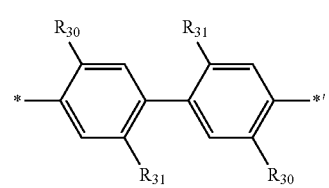

Formula 4E

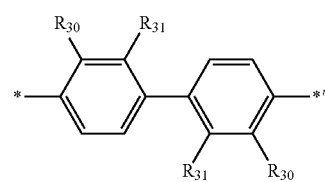

Formula 4F

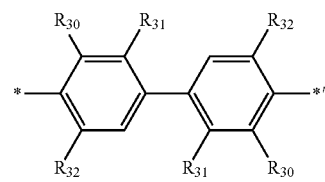

Formula 4G

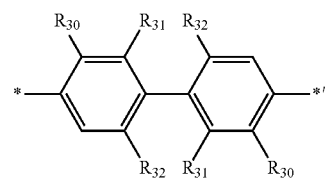

Formula 4H

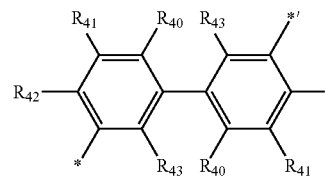

Formula 4I

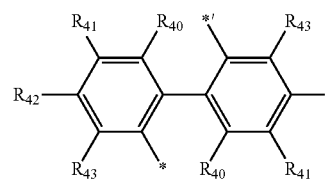

wherein $R_{30}$ through $R_{32}$ are each independently a deuterium atom; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof; and $R_{40}$ through $R_{43}$ are each independently hydrogen; deuterium; a halogen atom; a hydroxyl group; a cyano group; a nitro group; an amino group; an amidino group; a hydrazine group; a hydrazone group; a carboxyl group or a salt thereof; an ester group; a sulfonic acid group or a salt thereof; a phosphoric acid or a salt thereof; a $C_1$-$C_{20}$ alkyl group; a $C_1$-$C_{20}$ alkoxy group; or a $C_1$-$C_{20}$ alkyl group and a $C_1$-$C_{20}$ alkoxy group that are substituted with a deuterium atom, a halogen atom, a hydroxyl group, a cyano group, a nitro group, an amino group, an amidino group, a hydrazine group, a hydrazone group, a carboxyl group or a salt thereof, an ester group, a sulfonic acid group or a salt thereof, and a phosphoric acid or a salt thereof.

7. The polymer of claim 1, wherein the polymer is an alternating copolymer comprising the repeating unit of Formula 1 and the additional repeating unit of Formula 2 or a random copolymer comprising the repeating unit of Formula 1 and the additional repeating unit of Formula 2.

8. The polymer of claim 1, wherein the polymer has a weight average molecular weight in a range of about 2,000 Da to about 1,000,000 Da.

9. An organic light-emitting diode comprising a substrate; a first electrode; a second electrode; and an organic layer interposed between the first electrode and the second electrode and comprising the polymer of claim 1.

10. The organic light-emitting diode of claim 9, wherein the organic layer comprises an emission layer, wherein the emission layer comprises the polymer.

11. The organic light-emitting diode of claim 10, wherein the emission layer further comprises a phosphorescent dopant for which the polymer is a phosphorescent host.

12. The organic light-emitting diode of claim 11, wherein the phosphorescent dopant comprises an organometallic complex comprising one of iridium (Ir), platinum (Pt), osmium (Os), rhenium (Re), titanium (Ti), zirconium (Zr), hafnium (Hf), and any combinations thereof.

13. The organic light-emitting diode of claim 11, wherein an amount of the phosphorescent dopant in the emission layer is in a range of about 1 wt % to about 10 wt %.

14. The polymer of claim 1, wherein $X_1$ is —Si($R_{22}$)($R_{23}$)—, —S—, or —O—.

* * * * *